United States Patent
Cohen et al.

(10) Patent No.: US 11,805,713 B2
(45) Date of Patent: Oct. 31, 2023

(54) DRIFT MITIGATION FOR RESISTIVE MEMORY DEVICES

(71) Applicant: International Business Machines Corporation, Armonk, NY (US)

(72) Inventors: Guy M. Cohen, Ossining, NY (US); Takashi Ando, Eastchester, NY (US); Nanbo Gong, White Plains, NY (US); Kevin W. Brew, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 17/540,820

(22) Filed: Dec. 2, 2021

(65) Prior Publication Data

US 2023/0180643 A1 Jun. 8, 2023

(51) Int. Cl.
*G11C 11/00* (2006.01)
*H10N 70/20* (2023.01)
*G11C 13/00* (2006.01)
*H10N 70/00* (2023.01)

(52) U.S. Cl.
CPC ....... *H10N 70/235* (2023.02); *G11C 13/0004* (2013.01); *G11C 13/004* (2013.01); *G11C 13/0069* (2013.01); *H10N 70/841* (2023.02); *H10N 70/882* (2023.02); *H10N 70/883* (2023.02); *G11C 2013/0045* (2013.01)

(58) Field of Classification Search
CPC .............. G11C 13/0004; G11C 13/004; G11C 13/0069; G11C 13/0045
USPC ......................................................... 365/148
See application file for complete search history.

(56) References Cited

U.S. PATENT DOCUMENTS

| | | | |
|---|---|---|---|
| 7,494,849 B2 | 2/2009 | Oliva et al. | |
| 7,579,616 B2 | 8/2009 | Chen et al. | |
| 7,880,194 B2 | 2/2011 | Breitwisch et al. | |
| 9,257,647 B2 | 2/2016 | Borodulin et al. | |
| 9,647,209 B2 | 5/2017 | Goktepeli et al. | |
| 10,700,270 B2 | 6/2020 | Borodulin et al. | |
| 10,748,059 B2 | 8/2020 | Copel et al. | |
| 10,777,291 B2 | 9/2020 | Tortorelli et al. | |
| 10,840,241 B2 * | 11/2020 | Kim | H01L 28/20 |
| 11,004,511 B2 | 5/2021 | Cohen et al. | |
| 2011/0001112 A1 * | 1/2011 | Kiyotoshi | H10B 63/20 |
| | | | 257/E29.094 |
| 2020/0411754 A1 * | 12/2020 | Ruiz | H10N 70/8413 |

OTHER PUBLICATIONS

P. Mell et al., "The NIST Definition of Cloud Computing," Recommendations of the National Institute of Standards and Technology, Special Publication 800-145, Sep. 2011, 7 pages.

* cited by examiner

*Primary Examiner* — Vu A Le
(74) *Attorney, Agent, or Firm* — Erik Johnson; Ryan, Mason & Lewis, LLP

(57) ABSTRACT

Resistive memory devices are provided which are configured to mitigate resistance drift. A device comprises a phase-change element, a resistive liner, a first electrode, a second electrode, and a third electrode. The resistive liner is disposed in contact with a first surface of the phase-change element. The first electrode is coupled to a first end portion of the resistive liner. The second electrode is coupled to a second end portion of the resistive liner. The third electrode is coupled to the first surface of the phase-change element.

20 Claims, 20 Drawing Sheets

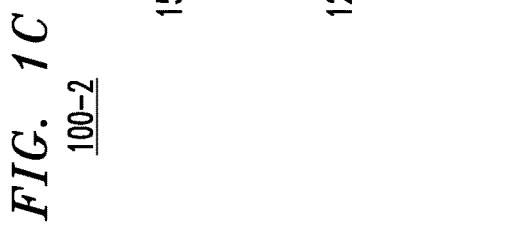
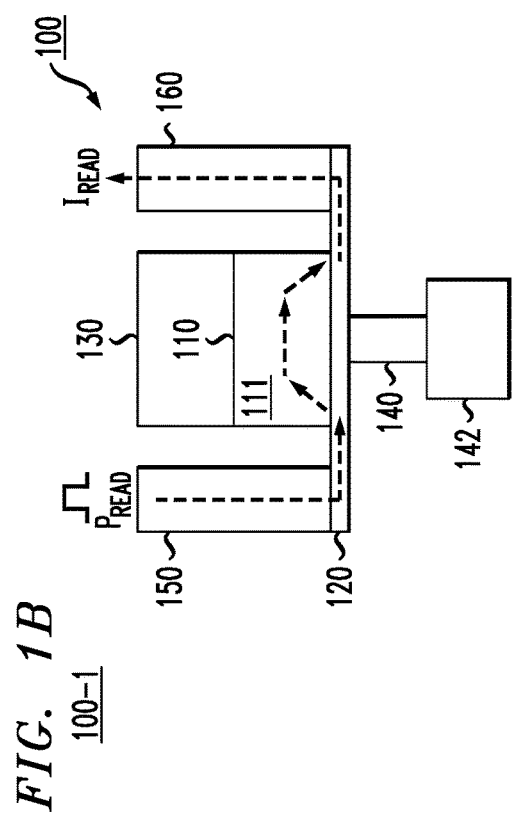
FIG. 1B
100-1
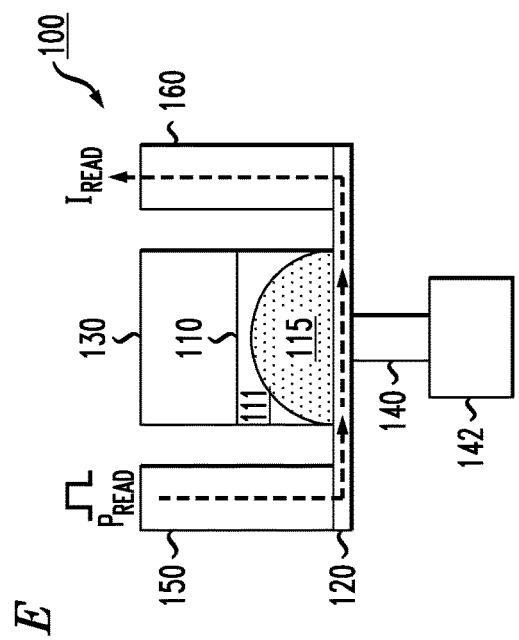
FIG. 1C
100-2
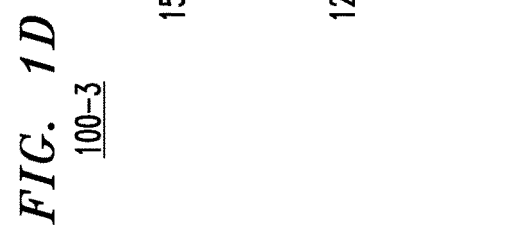
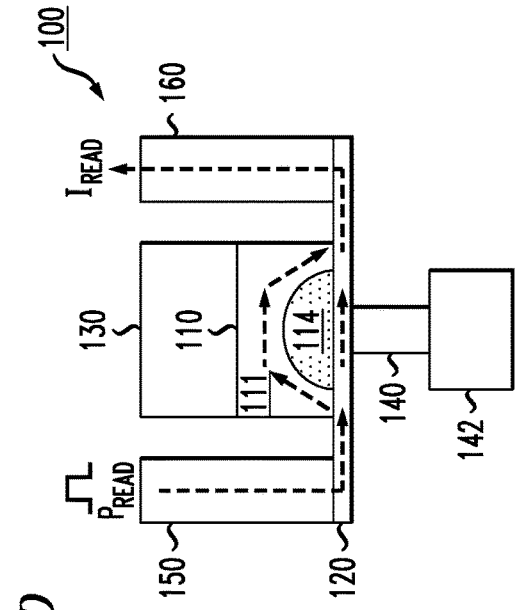
FIG. 1D
100-3
FIG. 1E
100-4

200

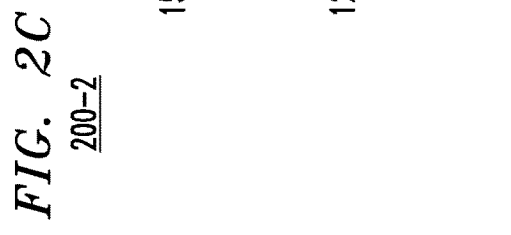
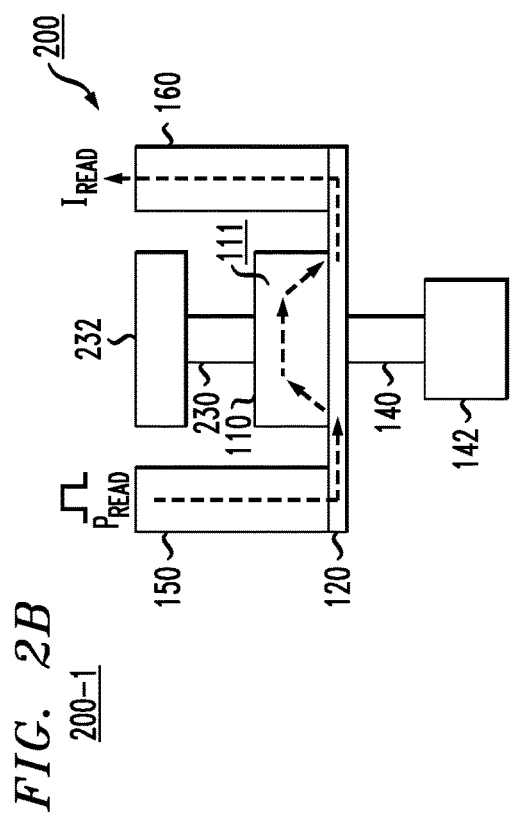
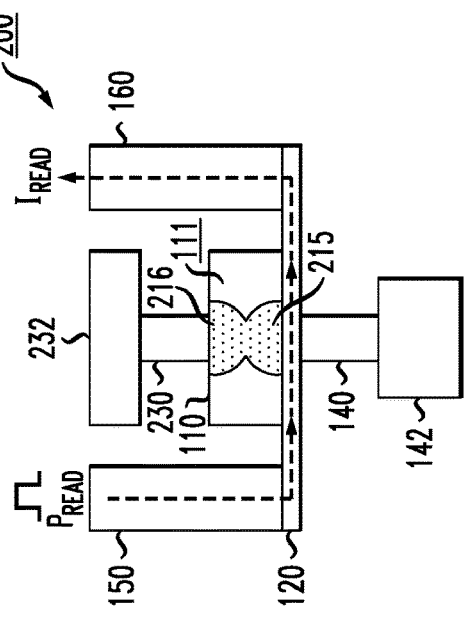
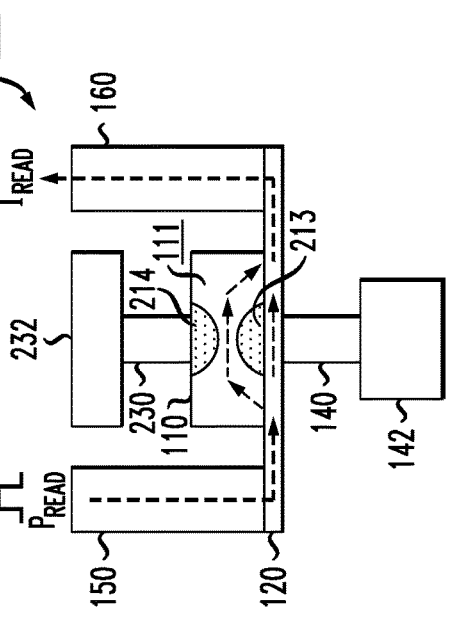

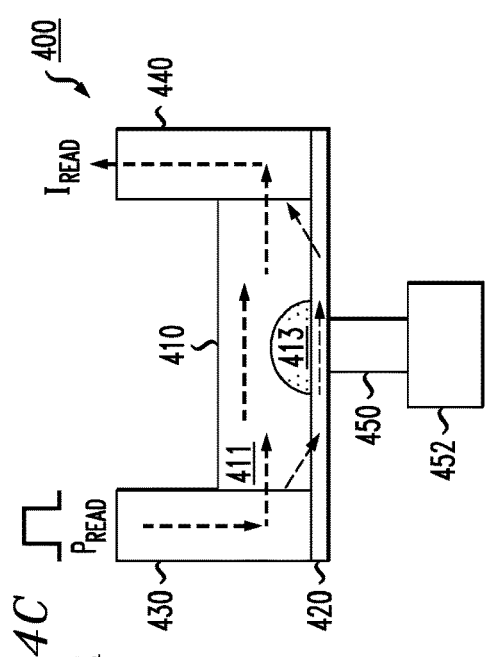
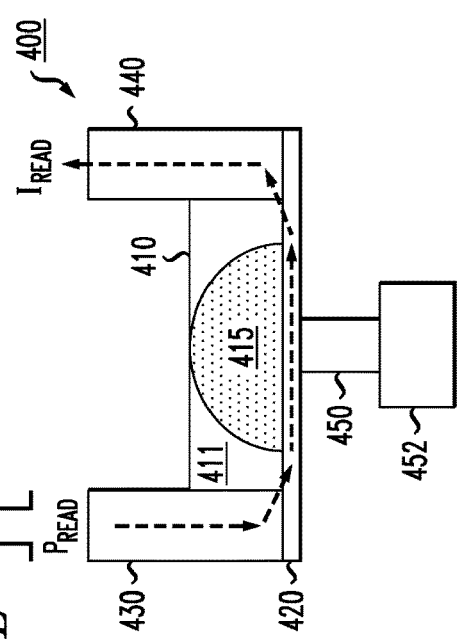
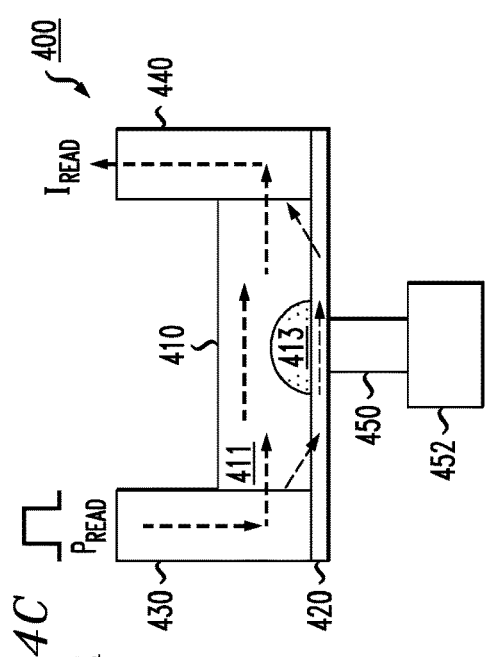
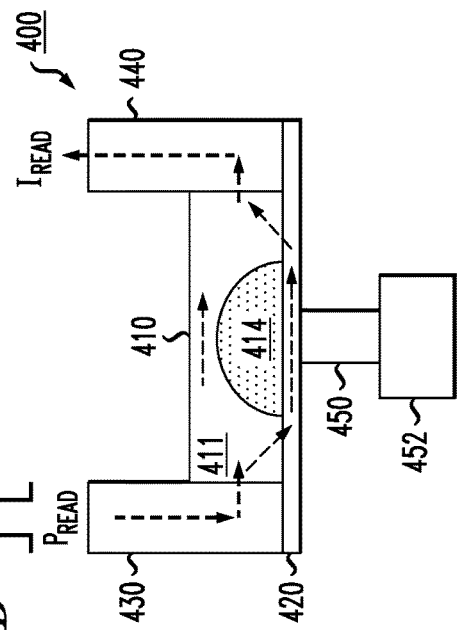
FIG. 4B
400-1
FIG. 4C
400-2
FIG. 4D
400-3
FIG. 4E
400-4

500-2

500-4

500-1

500-3

DRIFT MITIGATION FOR RESISTIVE MEMORY DEVICES

BACKGROUND

This disclosure relates generally to resistive memory devices and, in particular, phase-change material (PCM) devices for implementing resistive processing unit (RPU) systems for neuromorphic computing. Information processing systems such as neuromorphic computing systems and artificial neural network systems are utilized in various applications such as machine learning and inference processing for cognitive recognition and computing. Such systems are hardware-based systems that generally include a large number of highly interconnected processing elements (referred to as "artificial neurons") which operate in parallel to perform various types of computations. The artificial neurons (e.g., pre-synaptic neurons and post-synaptic neurons) are connected using artificial synaptic devices which provide synaptic weights that represent connection strengths between the artificial neurons. The synaptic weights can be implemented using an array of resistive processing unit (RPU) cells having tunable resistive memory devices (e.g., tunable conductance), which exhibit non-volatile and multi-level memory characteristics, wherein conductance states of the RPU cells are encoded or otherwise mapped to the synaptic weights.

SUMMARY

Exemplary embodiments of the disclosure include resistive memory devices (e.g., phase-change material (PCM) devices) which are structurally configured to mitigate resistance drift, as well as resistive processing unit systems which utilize such resistive memory devices with drift mitigation, and neuromorphic computing systems which utilize such resistive memory devices with drift mitigation to implement synaptic devices for artificial neural networks.

For example, an exemplary embodiment includes a device which comprises a phase-change element, a resistive liner, a first electrode, a second electrode, and a third electrode. The resistive liner is disposed in contact with a first surface of the phase-change element. The first electrode is coupled to a first end portion of the resistive liner. The second electrode is coupled to a second end portion of the resistive liner. The third electrode is coupled to the first surface of the phase-change element.

Other embodiments will be described in the following detailed description of exemplary embodiments, which is to be read in conjunction with the accompanying figures.

BRIEF DESCRIPTION OF THE DRAWINGS

FIGS. 1B, 1C, 1D, and 1E schematically illustrate readout operations that are performed for different programmed states of the PCM device 100 of FIG. 1A, according to an exemplary embodiment of the disclosure.

FIGS. 2B, 2C, 2D, and 2E schematically illustrate readout operations that are performed for different programmed states of the PCM device of FIG. 2A, according to an exemplary embodiment of the disclosure.

FIGS. 4B, 4C, 4D, and 4E schematically illustrate readout operations that are performed for different programmed states of the PCM device of FIG. 4A, according to an exemplary embodiment of the disclosure.

DETAILED DESCRIPTION

Figure 1A:
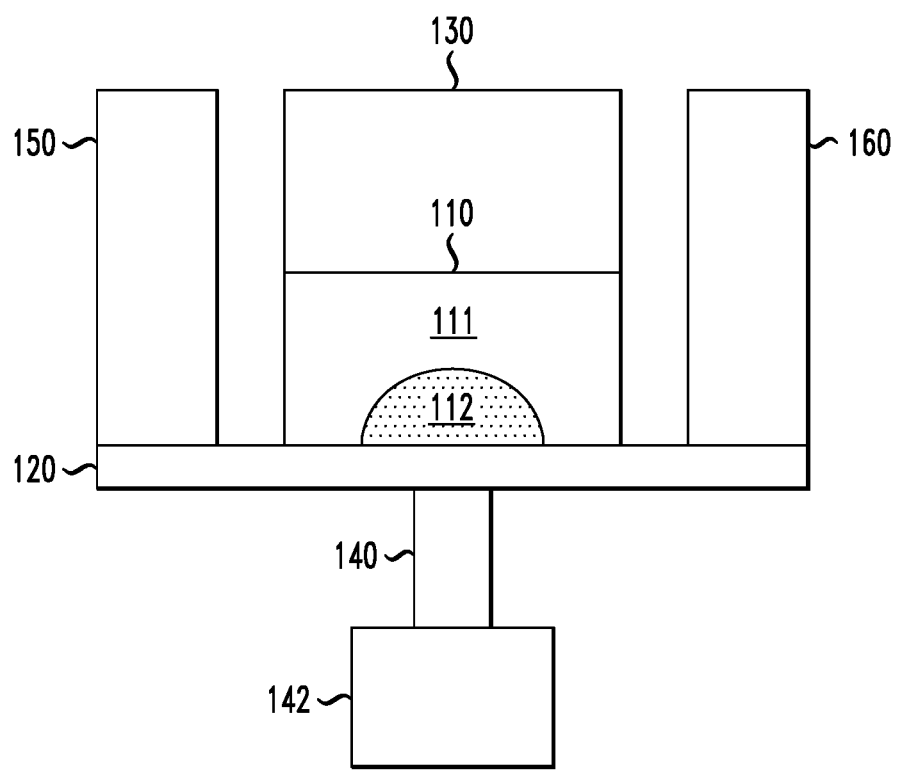
FIG. 1A schematically illustrates a PCM device which is configured to mitigate resistance drift, according to an exemplary embodiment of the disclosure.

Embodiments of the disclosure will now be described in further detail with regard to phase-change material (PCM) devices which are structurally configured to mitigate resistance drift, as well as RPU systems which utilize such PCM devices for in-memory computing applications, and neuromorphic computing systems which utilize such PCM devices to implement artificial synaptic devices for artificial neural networks.

In general, a PCM device comprises an active phase-change material layer (e.g., chalcogenide layer) disposed between two electrodes, wherein resistive tuning of the PCM device involves applying a programming current pulse through the PCM layer to transition the PCM layer to one of (i) a high-resistance amorphous phase (referred to as Reset state), (ii) a low-resistance crystalline phase (referred to as Set state), or (iii) one of a plurality of intermediate resistance states between the Reset and Set states by tuning the programming conditions (e.g., pulse-width and amplitude). In some embodiments, phase-change is obtained through joule-heating of the PCM layer, when electrical bias or pulses are applied to the electrodes PCM devices can be programmed to a high-resistance (or reset) state by creating a resistive amorphous region inside the PCM layer. Heating the PCM layer above its melting temperature and then quickly quenching it gives rise to formation of amorphous region(s) within the PCM layer. A low-resistance state (or Set state) can be obtained by creating crystalline regions in the chalcogenide layer. Crystallization occurs when the chalcogenide layer is heated to or above its crystallization temperature for sufficient duration. In addition, crystallization occurs when the chalcogenide layer is heated above its melting temperature, and slowly cooled to allow for crystallization of the phase-change material. Intermediate resistance states can also be obtained by carefully tuning the programming conditions (i.e., pulse-width and amplitude).

While phase change memory devices are strong candidates for implementing artificial synaptic devices for neuromorphic computing systems, PCM devices suffer from a "resistance drift" effect in which the PCM layer of a PCM device is not entirely stable. In particular, melt-quenched amorphous regions created inside a PCM layer undergo certain changes over time, which causes the resistance of the PCM device to increase with time, a phenomenon referred to as "resistance drift." In general, the resistance drift is based on factors such as the initial programmed resistance and is characterized by the drift coefficient (v) parameter. In this regard, resistance drift occurs in the PCM layer of a PCM device which is in an amorphous phase (Reset state), or in an intermediate state between the Reset state and the crystalline phase (Set state). Typically, the resistance drift is larger when the PCM layer is in the amorphous phase (Reset state).

On the other hand, the crystalline or low-resistance Set state of the PCM layer is shown to be substantially free from resistance-drift, although crystalline doped PCM may exhibit some resistance drift. For artificial neural networks having artificial synaptic devices that are implemented using PCM devices with resistance states that encode values of trained synaptic weights, the resistance-drift of programmed PCM devices can cause undesired change in the values of the trained synaptic weights. Exemplary embodiments of the disclosure provide PCM devices which are structurally configured to mitigate the impact of resistance drift such that programmed PCM devices with amorphous regions or intermediate resistance states maintain a stable resistance over time, despite resistance drift of the PCM.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g., the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1A schematically illustrates a PCM device which is configured to mitigate resistance drift, according to an exemplary embodiment of the disclosure. More specifically, FIG. 1A is a schematic cross-sectional view of a PCM device 100 which comprises a layer of phase-change material 110 (alternatively, PCM layer 110, or phase-change element 110), a resistive liner 120, a first electrode 130 (e.g., top electrode), a second electrode 140 (e.g., bottom electrode), an electrode contact 142, a third electrode 150, and a fourth electrode 160. The first electrode 130 is disposed on first surface of the PCM layer 110, and at least a portion of the resistive liner 120 is disposed on a second surface of the PCM layer 110, opposite the first surface. The resistive liner 120 comprises first and second end portions which are coupled to the third and fourth electrodes 150 and 160, respectively. The first and second ends of the resistive liner 120 extend past opposing side surfaces of the PCM layer 110. The second electrode 140 is coupled to the second surface of the PCM layer 110 through the resistive liner 120.

The PCM layer 110 can be formed using any suitable material which exhibits a relatively large resistivity contrast between crystalline (low resistivity) and amorphous (high resistivity) phases of the phase-change material. For example, in some embodiments, the PCM layer 110 comprises a chalcogenide alloy of germanium (Ge), antimony (Sb) and tellurium (Te) (GST) with, e.g., a Ge:Sb:Te element ratio of 2:2:5. For illustrative purposes, FIG. 1A schematically illustrates a state of the PCM device 100 in which a portion of the volume of the PCM layer 110 comprises an amorphous region 112, while the remaining volume of the PCM layer 110 comprises a crystalline region 111.

The exemplary PCM device 100 comprises a four-terminal device with separate programming and readout terminals to enable programming and readout operations to be performed in an independent and non-synchronized manner. In particular, the first and second electrodes 130 and 140 (alternatively, programming electrodes 130 and 140) are utilized for programming a resistive state of the PCM device 100, and the third and fourth electrodes 150 and 160 (alternatively, readout electrodes 150 and 160) are utilized for reading the programmed resistive state of the PCM device 100. The programming electrodes 130 and 140 are coupled to programming circuitry, while the readout electrodes 150 and 160 are coupled to readout circuity. In some embodiments, the electrodes 130, 140, 150, and 160 are formed of an electrically conductive material such as tungsten, other types of conductive or metallic materials which are suitable for the given application.

In some embodiments, the PCM device 100 is programmed by applying a programming pulse to the first electrode 130 to cause programming current to flow from the first electrode 130 to the second electrode 140 through the PCM layer 110. The magnitude and duration of the programming current will vary depending on the target programmed resistive state of the PCM device 100. During a programming operation the readout electrodes 150 and 160 are held in a floating state. The PCM layer 110 can be switched from a low conductive state to a high conductive state, and vice-versa, or any intermediate conductive state therebetween, by applying programming pulses to the PCM device 100 to incrementally change the size of the amorphous region 112 of the PCM layer 110, or otherwise convert the entire amorphous region 112 into crystalline phase-change material.

For example, an amorphizing programming pulse with a given magnitude and duration can be applied to the PCM device 100 to form the amorphous region 112 in the PCM layer 110. More specifically, in some embodiments, the amorphous region 112 as shown in FIG. 1A is formed by applying a relatively large programming current pulse for a short period of time which causes a portion of the volume of phase-change material of the PCM layer 110, which is in proximity to the bottom electrode 140, to melt and then rapidly quench, thereby forming the amorphous region 112. The melting of the phase-change material is the result of "joule heating" due to current crowding (i.e., increased current density) near the region of contact between the phase-change material and the bottom electrode 140, wherein the joule heating causes the temperature of the phase-change material to reach or exceed the melting temperature of the phase-change material (e.g., 600 degrees Celsius for GST). The melting and rapid cooling of the phase-change material causes formation of the mushroom-shaped amorphous region 112.

On the other hand, a crystallizing programming pulse with a given magnitude and duration can be applied to the PCM device 100 to convert the amorphous region 112 of the PCM layer 110 back into a crystalline phase, or otherwise decrease the volume of the amorphous region 112. More specifically, in some embodiments, the amorphous region 112 as shown in FIG. 1A can be recrystallized by applying a programming current pulse for a given period of time which causes phase-change material to increase to a temperature which is higher than a crystallization point of the phase-change material (for example, about 160° C. for GST), but less than the melting point of the phase-change material, to thereby transform the amorphous material into a crystalline state with a much lower resistance. For example, with a "growth dominated" crystallization property, the amorphous phase-change material (amorphous region 112) at the boundary with the crystalline phase-change material (crystalline region 111) will recrystallize by templating from the surrounding crystalline phase-change material. With this process, the volume of the amorphous phase-change material reduces over time as the boundary region of the amorphous phase-change material crystallizes.

The programmed state of the PCM device 100 can be determined by applying a read pulse to the third electrode 150 (or the fourth electrode 160), and determining a read current that flows out from the fourth electrode 160 (or the third electrode 150), wherein the magnitude of the read current is utilized to determine the programmed state of the PCM device 100. In the exemplary embodiment of FIG. 1A, the resistive liner 120 provides a resistive electrical connection between the readout electrodes 150 and 160. In addition, the resistive liner 120 serves to mitigate the resistance drift of the PCM device 100 when the PCM device 100 is in a programmed resistive state, such as shown in FIG. 1A, in which the volume of the PCM layer 110 comprises a crystalline phase (e.g., crystalline region 111) and an amorphous phase (e.g., amorphous region 112). As explained in further detail below, the resistive liner 120 mitigates the effect of the resistance drift of the amorphous region 112 by effectively electrically shunting the amorphous region 112 during readout of the PCM device 100.

The resistive liner 120 is configured to have a constant resistance which is based on function of, e.g., (i) a length of the resistive liner 120 between the readout electrodes 150 and 160, (ii) a cross-sectional area (width×thickness) of the resistive liner 120, and (iii) a resistivity $\rho$ of the material which forms the resistive liner 120. The resistive liner 120 is configured to have a stable resistance (i.e., no resistance drift). In some embodiments, the resistive liner 120 is formed of tantalum nitride (TaN), wherein the amount of nitrogen can be adjusted to tune the resistivity of the resistive liner 120 (e.g., assuming fixed dimensions, the amount of N can be increased to increase the resistance of the resistive liner 120). In other embodiments, the resistive liner 120 can be formed of a doped carbon material (e.g., hydrogen-doped carbon), or a conducting oxide material, or any other suitable electrically conductive materials, etc.

In some embodiments, the resistive liner 120 is configured to have a resistance ($R_L$) which is greater than a resistance ($R_C$) of a crystalline region of the PCM layer 110, but which is less than a resistance ($R_A$) of an amorphous region (e.g., amorphous region 115, FIG. 1E) of the PCM layer 110 (e.g., $R_C<R_L<R_A$). For example, in an exemplary, non-limiting embodiment, assuming a resistance $R_A$ of an amorphous region of the PCM layer 110 is about 100 times greater than a resistance $R_C$ of the crystalline region of the PCM layer 110 (e.g., $R_A\approx100\times R_C$), the resistive liner 120 can be configured to have a fixed resistance $R_L$ which is about 10 times greater than a resistance of a crystalline region of the PCM layer 110 (e.g., $R_L\approx10\times R_C$). In this exemplary embodiment, a resistance $R_A$ of an amorphous region of the PCM layer 110 is about 10 times greater than the fixed resistance $R_L$ of the resistive liner 120 (e.g., $R_A 10\times R_L$).

In the exemplary embodiment of FIG. 1A, since a resistance $R_A$ of an amorphous region of the PCM layer 110 is substantially greater than the resistances $R_L$ and $R_C$ of the resistive liner 120 and a crystalline region of the PCM layer 110, the effective resistance between the readout electrodes 150 and 160 is substantially a function of the resistance $R_C$ of the crystalline region of the PCM layer 110, and the fixed resistance $R_L$ of the resistive liner 120. In this regard, for a given programmed state of the PCM device 100 in which the PCM layer 110 has a region of amorphous phase-change material (e.g., amorphous region 112), the resistive liner 120 and the crystalline PCM 111 (if not blocked by amorphous material as in FIG. 1E) in effect electrically shunts the amorphous region of the PCM layer 110 so that that any resistance drift of the amorphous region has a negligible effect on the effective resistance of the PCM device 100 for the given programmed state. Moreover, as noted above, since the resistance of the resistive liner 120 is fixed and stable, and since the crystalline phase-change material is substantially free from resistance drift, the effective resistance of the PCM device 100 will remain substantially constant notwithstanding any resistance drift of an amorphous region of phase-change material in the PCM layer 110. In this exemplary configuration, for a given readout voltage applied to the PCM device 100, the magnitude of the readout current that flows from the PCM device 100 for a given programmed state of the PCM device 100 is based on effective resistance of the PCM device 100 and, thus, the readout current will remain relatively constant for the given programmed state of the PCM device 100 irrespective of any resistance drift of an amorphous region of the PCM layer 110.

FIGS. 1B, 1C, 1D, and 1E schematically illustrate readout operations that are performed for different programmed states of the PCM device 100 of FIG. 1A, according to an exemplary embodiment of the disclosure. For example, FIG. 1B schematically illustrates a programmed state 100-1 of the PCM device 100 in which an entirety of the PCM layer 110 comprises crystalline phase-change material 111, with no amorphous region. Further, FIGS. 1C, 1D, and 1E schematically illustrate respective programmed states 100-2, 100-3, and 100-4 of the PCM device 100 in which the PCM layer 110 comprises respective amorphous regions 113, 114, and 115, which are progressively larger in volume. The amorphous regions 113, 114, and 115 are formed using programming methods as discussed above, the details of which will not be repeated.

Moreover, FIGS. 1B, 1C, 1D, and 1E schematically illustrate exemplary readout operations that are performed by applying a read pulse ($P_{READ}$) to the readout electrode 150 to generate a read current ($I_{READ}$) that flows from the readout electrode 160. In the exemplary embodiments of FIGS. 1B, 1C, 1D, and 1E, the flow of read current through the PCM device 100 is illustrated by dashed-line arrows, wherein different thicknesses of the dashed-line arrows schematically represent different current magnitudes (e.g., thicker dashed-line arrows represent greater current magnitude). The programmed state 100-1 of the PCM device 100 shown in FIG. 1B represents a lowest resistance state (or highest conductance state) of the PCM device 100 wherein the effective resistance of the PCM device is primarily based on the low resistance of the crystalline region 111 which occupies the entire volume of the PCM layer 110. In the exemplary programmed state 100-1 of FIG. 1B, the PCM layer 110, in effect, electrically shunts the overlapping portion of the resistive liner 120, such that substantially all the read current flows through the PCM layer 110, and not the overlapping portion of the resistive liner 120.

The programmed states 100-2 and 100-3 of the PCM device 100 as shown in FIGS. 1C and 1D represent intermediate resistance states (or intermediate conductance states) of the PCM device 100 which are higher in resistance (lower conductance) than the programmed state 100-1 of the PCM device 100 of FIG. 1B due to the respective amorphous regions 113 and 114 formed in the PCM layer 110, as well as reduction in the contact area between the crystalline region 111 and the resistive liner 120. As the volume of the amorphous region increases in the PCM layer 110, the volume of the crystalline region 111 decreases in the PCM layer 110, which causes an increase in the resistance of the crystalline region 111 of the PCM layer 110. As the volume of the crystalline region 111 decreases and the resistance of the crystalline region 111 of the PCM layer 110 increases, a larger portion of the read current flows through the portion of the resistive liner 120 which overlaps the PCM layer 110. In effect, the crystalline region 111 of the PCM layer 110 and the overlapping portion of the resistive liner 120 comprise parallel-connected resistors, which causes the read current to split between two current paths—one current path through the crystalline region 111 of the PCM layer 110, and another current path through the overlapping portion of the resistive liner 120, based on the resistances of the two current paths. In addition to the change in volume of the crystalline region 111 caused by the formation of the amorphous region 113, 114 or 115, the change in the contact area between the resistive liner 120 and the crystalline region 111 also modulates the total resistance of the PCM device 100. The resistance contribution to the total resistance is proportional to the contact resistivity (measured in $\Omega cm^2$) between crystalline region 111 and the resistive liner 120, divided by the contact area.

With the exemplary programmed states of the PCM device 100 shown in FIGS. 1C and 1D, the overlapping portion of the resistive liner layer 120 serves to electrically shunt the amorphous regions 113 and 114 such that a negligible amount of current flows through the amorphous regions 113 and 114. In this regard, for reasons discussed above, the intermediate programmed states 100-2 and 100-3 will remain stable over time, irrespective of any resistance drift of the amorphous regions 113 and 114. More specifically, with the programmed state 100-2 of the PCM device 100 shown in FIG. 1C, each time a read pulse $P_{READ}$ of a given magnitude is applied to the readout electrode 150, the magnitude of the read current $I_{READ}$ which flows from the readout electrode 160 will be substantially the same over time, despite an increase in the resistance of the amorphous region 113 due to resistance drift. Similarly, with the programmed state 100-3 of FIG. 1D, each time a read pulse $P_{READ}$ of a given magnitude is applied to the readout electrode 150, the magnitude of the read current $I_{READ}$ which flows from the readout electrode 160 will be substantially the same over time, despite an increase in the resistance of the amorphous region 114 due to resistance drift.

The programmed state 100-4 of the PCM device 100 as shown in FIG. 1E represents a highest resistance state (or lowest conductance state) of the PCM device 100, wherein the effective resistance of the PCM device 100 is primarily based on the fixed resistance of the resistive liner 120. In particular, FIG. 1E schematically illustrates the programmed state 100-4 in which a volume of the amorphous region 115 of the PCM layer 110 is significantly large and expands an entire length of the overlapping portion of the resistive liner 120. In this programmed state 100-4, the amorphous region 115 electrically isolates the resistive liner 120 from the remaining volume of the crystalline region 111 of the PCM layer 110. As such, the effective resistance of the PCM device 100 is based substantially on the fixed resistance of the resistive liner 120, wherein substantially all of the read current $I_{READ}$ flows in the current path through the resistive liner 120, with a negligible amount of current flow through the PCM layer 110. With the programmed state 100-4 of FIG. 1E, the resistive liner 120, in effect, electrically shunts the entire PCM layer 110. Consequently, the programmed state 100-4 will remain stable over time, irrespective of any resistance drift of the amorphous region 115.

The exemplary PCM device 100 of FIG. 1A provides various advantages over conventional PCM device configurations which do not implement the resistive liner 120 and which do not include the separate readout electrodes 150 and 160, but rather utilize the first and second electrodes 130 and 140 for both programming and readout. In such a conventional PCM device, a read voltage pulse is applied to the first electrode to cause a read current to flow from the first electrode 130 to the second electrode 140 through the PCM layer 110. In this configuration, the amorphous region 112 is in series with any crystalline region 111 of the PCM layer 110, wherein the effective resistance of the conventional PCM device is based on the series resistance of the crystalline and amorphous regions 111 and 112 of the PCM layer between the first and second electrode 130 and 140. However, this conventional configuration suffers from instability of intermediate states of the PCM device due to resistance drift of the amorphous region 112.

In addition, since the first and second electrodes 130 and 140 are used for both programming and readout of the conventional PCM device, a low-voltage read pulse must be applied to readout the state of the PCM device to ensure that the read pulse does not perturb the resistance state of the PCM device. Indeed, if the magnitude of the read pulse is too large, the read pulse can effectively change a resistance state of the PCM device (e.g., a portion of the amorphous region is crystallized due to the read pulse, etc.).

The exemplary PCM device 100 of FIG. 1A addresses these issues by the use of separate sets of programming electrodes 130 and 140 and readout electrodes 150 and 160, and by use of the resistive liner 120 which connects the readout electrodes 150 and 160. Indeed, as noted above, the implementation of the resistive liner 120 serves to mitigate the effect of resistance drift of the amorphous region, which is formed in the PCM layer 110, by effectively shunting the amorphous region. The PCM device 100 provides sufficient resistance drift mitigation to effectively implement a multi-level PCM device that can be utilized for storing weights for artificial neural networks and neuromorphic computing applications.

In the exemplary PCM device of FIG. 1A, the size of the amorphous region in the PCM layer 110 serves to modulate the current paths between the crystalline region 111 of the PCM layer 110 and the resistive liner 120 by increasing/decreasing the size of the crystalline region 111, and thereby increasing/decreasing the resistance of the crystalline region 111. However, the resistance of the amorphous region 112 has a negligible effect on the magnitude of the read current $I_{READ}$ that is generated for a given programmed state of the PCM device 100 as the amorphous region 112 is effectively shunted by the resistive liner 120 as well as the crystalline region 111 for intermediate states.

In addition, the implementation of separate readout electrodes 150 and 160 of the PCM device 100 provides higher immunity to read disturbances since the readout does not use the programing electrodes. Consequently, a higher magnitude read pulse can be utilized for readout, which reduces noise. In addition, a readout operation can be performed immediately following a programming operation because the readout circuitry is separate from the programming circuity, with the readout circuitry coupled to the readout electrodes 150 and 160, and the programming circuitry coupled to the programming electrodes 130 and 140. In addition, the PCM device 100 provide symmetric I-V operation such that the read voltage pulses can be applied to either one of the readout electrodes 150 or 160, and substantially the same read current $I_{READ}$ will be output from the PCM device 100.

Figure 2A:
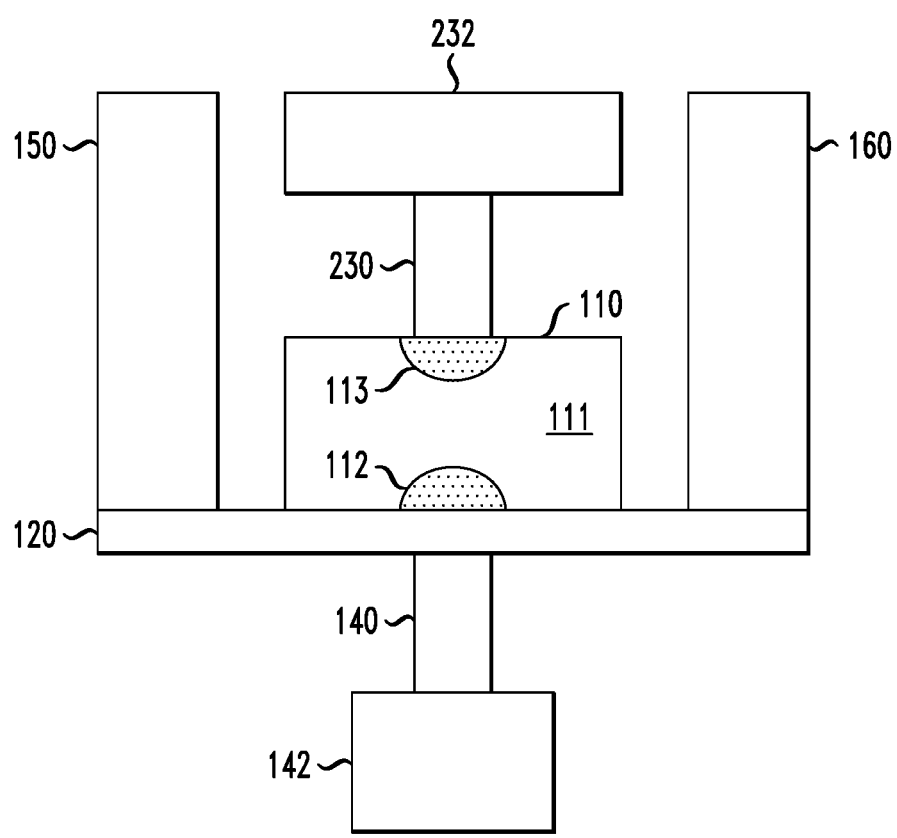
FIG. 2A schematically illustrates a PCM device which is configured to mitigate resistance drift, according to an exemplary embodiment of the disclosure.

FIG. 2A schematically illustrates a PCM device which is configured to mitigate resistance drift, according to another exemplary embodiment of the disclosure. More specifically, FIG. 2A is a schematic cross-sectional view of a PCM device 200 which is similar to the PCM device 100 of FIG. 1A, except that the PCM device 200 comprises a first electrode 230 (or top electrode 230) and electrode contact 232, wherein the first electrode 230 is narrow and has a smaller contact footprint with the first surface of the PCM layer 110, as compared to the first electrode 130 of the exemplary PCM device 100 shown FIG. 1A. The first electrode 230 and the second electrode 140 (or programming electrodes 230 and 140) are utilized for programming a resistive state of the PCM device 200 using similar techniques discussed above, except that the implementation the two narrow programming electrodes 140 and 230 enable the formation of respective mushroom-shaped amorphous regions 112 and 113 in the PCM layer 110.

For example, in some embodiments, the PCM device 200 is programmed by applying a programming pulse to the electrode contact 232 which causes programming current to flow from the first electrode 230 to the second electrode 140 through the PCM layer 110. During a programming operation, the readout electrodes 150 and 160 are held in a floating state. For example, an amorphizing programming pulse with a given magnitude and duration can be applied to the PCM device 200 to form the amorphous regions 112 and 113 in the PCM layer 110. As discussed above, the amorphous regions 112 and 113 are formed by applying a relatively large programming current pulse for a short period of time which causes portions of the PCM layer 110, which are in proximity to the respective programming electrodes 140 and 230, to melt and then rapidly quench, thereby forming the respective amorphous regions 112 and 113. The melting of the phase-change material is the result of "joule heating" due to current crowding (i.e., increased current density) near the regions of contact between the phase-change material and the programming electrodes 140 and 230, wherein the joule heating causes the temperature of the phase-change material to reach or exceed the melting temperature of the phase-change material.

Furthermore, as noted above, a crystallizing programming pulse with a given magnitude and duration can be applied to the PCM device 200 to convert the amorphous regions 112 and 113 of the PCM layer 110 back into a crystalline phase, or otherwise decrease the volume of the amorphous regions 112 and 113. More specifically, in some embodiments, the amorphous regions 112 and 113 as shown in FIG. 2A can be recrystallized by applying a programming current pulse for a given period of time which causes phase-change material to increase to a temperature which is higher than a crystallization point of the phase-change material, but less than the melting point of the phase-change material, to thereby transform the amorphous material using a "growth dominated" crystallization process.

FIGS. 2B, 2C, 2D, and 2E schematically illustrate readout operations that are performed for different programmed states of the PCM device 200 of FIG. 2A, according to an exemplary embodiment of the disclosure. For example, FIG. 2B schematically illustrates a programmed state 200-1 of the PCM device 200 in which an entirety of the PCM layer 110 comprises crystalline phase-change material 111, with no amorphous region. Further, FIGS. 2C, 2D, and 2E schematically illustrate respective programmed states 200-2, 200-3, and 200-4 of the PCM device 200 in which the PCM layer 110 comprises respective amorphous regions 211/212, 213/214, and 215/216, which are progressively larger in volume. The amorphous regions 211/212, 213/214, and 215/216 are formed using programming methods as discussed above, the details of which will not be repeated.

The programmed state of the PCM device 200 can be determined by placing the programming electrodes 230 and 140 in a floating state, and applying a read pulse to the third electrode 150 (or the fourth electrode 160), and determining a read current that flows out from the fourth electrode 160 (or the third electrode 150), wherein the magnitude of the read current is utilized to determine the programmed state of the PCM device 200. For example, FIGS. 2B, 2C, 2D, and 2E schematically illustrate exemplary readout operations that are performed by applying a read pulse ($P_{READ}$) to the readout electrode 150 to generate a read current ($I_{READ}$) that flows from the readout electrode 160. In the exemplary embodiments of FIGS. 2B, 2C, 2D, and 2E, the flow of read current through the PCM device 200 is illustrated by dashed-line arrows, wherein different thicknesses of the dashed-line arrows schematically represent different current magnitudes (e.g., thicker dashed-line arrows represent greater current magnitude).

The programmed state 200-1 of the PCM device 200 as shown in FIG. 2B represents a lowest resistance state (or highest conductance state (SET state)) of the PCM device 200 wherein the effective resistance of the PCM device 200 is primarily based on the low resistance of the crystalline region 111 which occupies the entire volume of the PCM layer 110. In the exemplary programmed state 200-1 of FIG. 2B, the PCM layer 110, in effect, electrically shunts the overlapping portion of the resistive liner 120, such that substantially all the read current flows through the PCM layer 110, and not the overlapping portion of the resistive liner 120.

The programmed states 200-2 and 200-3 of the PCM device 200 as shown in FIGS. 2C and 2D represent intermediate resistance states (or intermediate conductance states) of the PCM device 200 which are higher in resistance (lower conductance) than the programmed state 200-1 of the PCM device 200 of FIG. 2B due to the respective amorphous regions 211/212 and 213/214 formed in the PCM layer 110. As the volume of the amorphous regions 211/212 and 213/214 increase in the PCM layer 110, the amount of crystalline material of the crystalline region 111 between the amorphous regions 211/212 and 213/214 decreases, which causes an increase in the resistance of the crystalline region 111 of the PCM layer 110. In particular, a gap between the amorphous regions 211 and 212 of the PCM layer 110 in the programmed state 200-2 of FIG. 2C is relatively larger than a gap between the amorphous regions 213 and 214 of the PCM layer 110 in the programmed state 200-3 of FIG. 2D. In this regard, the PCM device 200 has a higher resistance in the programmed state 200-3 as compared to the programmed state 200-2.

As the volume of the crystalline region 111 decreases (e.g., as the gap between the amorphous regions in the PCM layer 110 decreases), the resistance of the crystalline region 111 of the PCM layer 110 increases, thereby causing a larger portion of the read current to flow through the portion of the resistive liner 120 which overlaps the PCM layer 110. Similar to the exemplary embodiments discussed above, in effect, the crystalline region 111 of the PCM layer and the overlapping portion of the resistive liner 120 comprise parallel-connected resistors, which causes the read current to split between two current paths—one current path through the crystalline region 111 of the PCM layer 110, and another current path through the overlapping portion of the resistive liner 120, based on the resistances of the two current paths.

With the exemplary programmed states of the PCM device 200 shown in FIGS. 2C and 2D, the overlapping portion of the resistive liner layer 120 serves to electrically shunt the amorphous regions 211/212, and 213/214 such that a negligible amount of current flows through the amorphous regions 211/212, and 213/214. In this regard, for reasons discussed above, the intermediate programmed states 200-2 and 200-3 will remain stable over time, irrespective of any resistance drift of the amorphous regions 211/212, and 213/214.

The programmed state 200-4 of the PCM device 200 as shown in FIG. 2E represents a highest resistance state (or lowest conductance state (RESET state)) of the PCM device 200, wherein the effective resistance of the PCM device 200 is primarily based on the fixed resistance of the resistive liner 120. In particular, FIG. 2E schematically illustrates the programmed state 200-4 in which a volume of the amorphous regions 215 and 216 are relatively large such that the amorphous regions 215 and 216 merge together, resulting in no crystalline phase-change material disposed in a gap therebetween (as compared to the programmed states 200-2 and 200-3). In this programmed state 200-4, the merged amorphous regions 215 and 216 prevent current flow in the PCM layer 110, and substantially all the read current $I_{READ}$ flows through the resistive liner 120. As such, the effective resistance of the PCM device 200 in the programmed state 200-4 is based substantially on the fixed resistance of the resistive liner 120, wherein substantially all of the read current $I_{READ}$ flows in the current path through the resistive liner 120, with a negligible amount of current flow through the PCM layer 110. In addition, with the programmed state 200-4 of FIG. 2E, the resistive liner 120, in effect, electrically shunts the entire PCM layer 110. Consequently, the programmed state 200-4 will remain stable over time, irrespective of any resistance drift of the merged amorphous regions 215 and 216.

Figure 3:
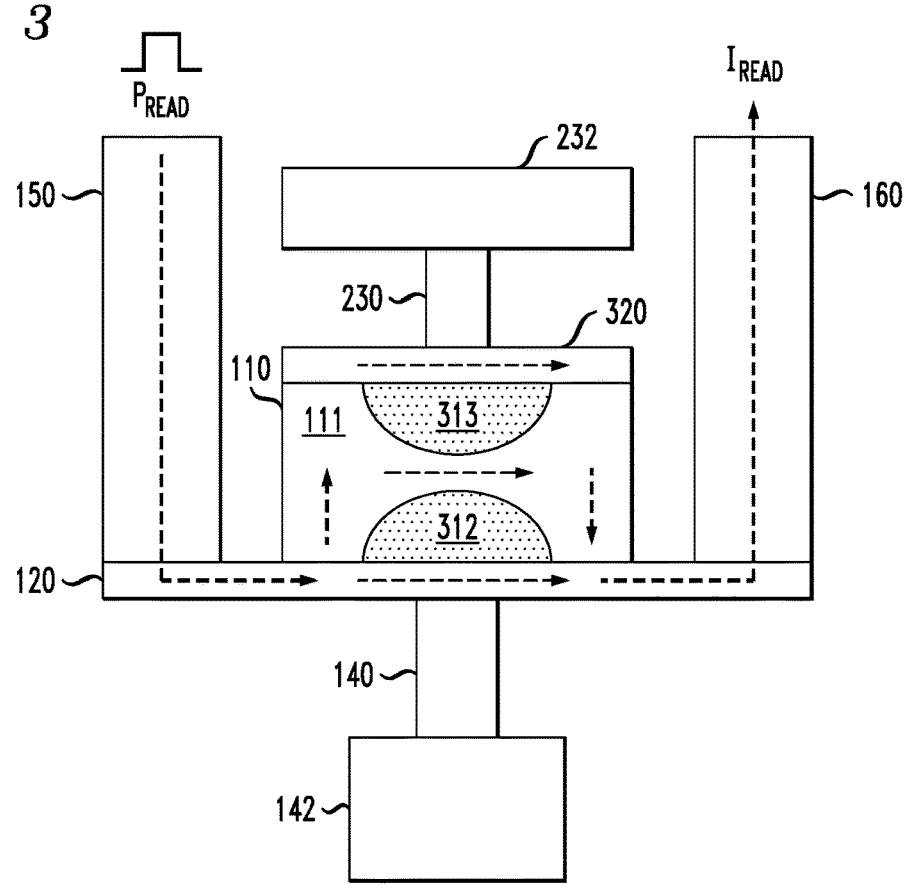
FIG. 3 schematically illustrates a PCM device which is configured to mitigate resistance drift, according to an exemplary embodiment of the disclosure.

FIG. 3 schematically illustrates a PCM device which is configured to mitigate resistance drift, according to another exemplary embodiment of the disclosure. More specifically, FIG. 3 is a schematic cross-sectional view of a PCM device 300 which is similar to the PCM device 200 of FIG. 2A, except that the PCM device 200 comprises an additional resistive liner 320 formed on the first surface of the PCM layer 110. In this exemplary embodiment, the resistive liners 120 and 320 provide enhanced tolerance to resistance drift of amorphous regions 312 and 313 formed in the PCM layer 110. The programming and readout operations for the PCM device 300 of FIG. 3 are similar to the programing and readout operations for the PCM device 200 as discussed above in conjunction with FIGS. 2A-2E.

FIG. 3 illustrates an exemplary readout operation that is performed with the PCM device 300 in an intermediate programmed state in which the PCM layer 110 comprises the amorphous regions 312 and 313 with some crystalline phase-change material disposed in a narrow gap between the amorphous regions 312 and 313. In this programmed state, the crystalline region 111 of the PCM layer 110, the overlapping portion of the resistive liner 120, and the entirety of the resistive liner 320 comprise parallel-connected resistors, which causes the read current to split between three current paths—one current path through the crystalline region 111 of the PCM layer 110 between the amorphous regions 312 and 313, a second current path through the overlapping portion of the resistive liner 120, and a third current path through the resistive liner 320, based on the resistances of the three current paths. In a RESET state (or highest resistance state), the PCM layer 110 comprises merged amorphous regions (similar to that shown in FIG. 2E), such that negligible current flows through the merged amorphous regions, and substantially all the current flows through the resistive liners 120 and 320, which are connected in parallel by the peripheral crystalline regions of the PCM layer 110 which surround the merged amorphous regions. It is to be noted that since the resistive liners 120 and 320 are effectively connected in parallel, one can adjust the thickness and/or a sheet resistance of the resistive liners 120 and 320 such that the highest resistance state of the PCM device 300 will be of same magnitude as a PCM device with just one resistive liner.

Figure 4A:
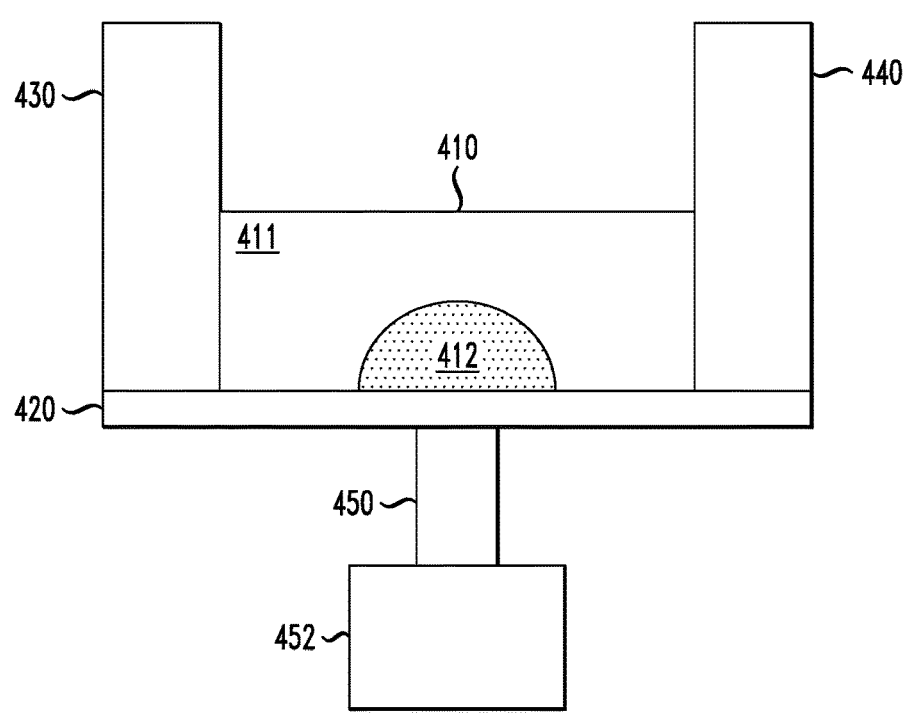
FIG. 4A schematically illustrates a PCM device which is configured to mitigate resistance drift, according to an exemplary embodiment of the disclosure.

FIG. 4A schematically illustrates a PCM device which is configured to mitigate resistance drift, according to an exemplary embodiment of the disclosure. More specifically, FIG. 4A is a schematic cross-sectional view of a PCM device 400 which comprises a PCM layer 410, a resistive liner 420, a first electrode 430, a second electrode 440, a third electrode 450, and an electrode contact 432. The first electrode 430 is disposed in contact with a first surface (e.g., first sidewall surface) of the PCM layer 410, and the second electrode 440 is disposed in contact with a second surface (e.g., second sidewall surface) of the PCM layer 410, opposite the first surface. In addition, the first and second electrodes 430 and 440 are coupled to respective end portions of the resistive liner 420. A portion of the resistive liner 420 is disposed in contact with a third surface (e.g., bottom surface) of the PCM layer 410. The third electrode 450 is coupled to the third (bottom) surface of the 410 through the resistive liner 420.

The exemplary PCM device 400 comprises a three-terminal device wherein the first, second, and third electrodes 430, 440, and 450 are utilized for programming a resistive state of the PCM device 300, and wherein the first and second electrodes 430 and 440 are utilized for reading the programmed resistive state of the PCM device 300. For illustrative purposes, FIG. 4A schematically illustrates a state of the PCM device 400 in which a portion of the volume of the PCM layer 410 comprises an amorphous region 412, while a remaining volume of the PCM layer 410 comprises a crystalline region 411. In some embodiments, the PCM layer 410, the resistive liner 420, the first electrode 430, the second electrode 440, the third electrode 450, and the electrode contact 432 are formed of the same or similar materials as the corresponding components of the PCM device 100 as discussed, the details of which will not be repeated.

In some embodiments, the PCM device 400 is programmed by applying a programming pulse to both the first and second electrodes 430 and 440 to cause programming current to flow from the first electrode 430 to the third electrode 450 through the PCM layer 410, and from the second electrode 440 to the third electrode 450 through the PCM layer 410. The magnitude and duration of the programming current will vary depending on the target programmed resistive state of the PCM device 400. The PCM layer 410 can be switched from a low conductive state to a high conductive state, and vice-versa, or any intermediate conductive state therebetween, by applying programming pulses to the PCM device 400 to incrementally change the size of the amorphous region 412 of the PCM layer 410, or otherwise convert the entire amorphous region 412 into crystalline phase-change material 411.

For example, an amorphizing programming pulse with a given magnitude and duration can be applied to both the first and second electrodes 430 and 440 of the PCM device 400 to form the amorphous region 412 in the PCM layer 410, wherein the amorphizing programming pulse generates programming current that causes a portion of the volume of phase-change material of the PCM layer 410, which is in proximity to the third (bottom) electrode 450, to melt and then rapidly quench, thereby forming an amorphous region (e.g., amorphous region 412). As noted above, the melting of the phase-change material is the result of "joule heating" due to current crowding (i.e., increased current density) near the region of contact between the phase-change material and the third (bottom) electrode 450, wherein the joule heating causes the temperature of the phase-change material to reach or exceed the melting temperature of the phase-change material.

Furthermore, a crystallizing programming pulse with a given magnitude and duration can be applied to both the first and second electrodes 430 and 440 of the PCM device 400 to convert the amorphous region 412 back into a crystalline phase, or otherwise decrease the volume of the amorphous region 412. More specifically, in some embodiments, the amorphous region 412 as shown in FIG. 4A can be recrystallized by applying a programming current pulse for a given period of time which causes phase-change material to increase to a temperature which is higher than a crystallization point of the phase-change material, but less than the melting point of the phase-change material, to thereby transform the amorphous phase-change material into crystalline phase-change material using a "growth dominated" crystallization process.

The programmed state of the PCM device 400 can be determined by placing the third electrode 450 in a floating state, and applying a read pulse to the first electrode 430 (or the second electrode 440), and determining a read current that flows out from the second electrode 440 (or the first electrode 430), wherein the magnitude of the read current is utilized to determine the programmed state of the PCM device 400. For example, FIGS. 4B, 4C, 4D, and 4E schematically illustrate readout operations that are performed for different programmed states of the PCM device 400 of FIG. 4A, according to an exemplary embodiment of the disclosure. For example, FIG. 4B schematically illustrates a programmed state 400-1 of the PCM device 400 in which an entirety of the PCM layer 410 comprises crystalline phase-change material 411, with no amorphous region. Further, FIGS. 4C, 4D, and 4E schematically illustrate respective programmed states 400-2, 400-3, and 400-4 of the PCM device 400 in which the PCM layer 410 comprises respective amorphous regions 413, 414, and 415, which are progressively larger in volume. The amorphous regions 413, 414, and 415 are formed using programming methods as discussed above, the details of which will not be repeated.

Moreover, FIGS. 4B, 4C, 4D, and 4E schematically illustrate exemplary readout operations that are performed by applying a read pulse ($P_{READ}$) to the readout electrode 430 to generate a read current ($I_{READ}$) that flows from the readout electrode 440. In the exemplary embodiments of FIGS. 4B, 4C, 4D, and 4E, the flow of read current through the PCM device 400 is illustrated by dashed-line arrows, wherein different thicknesses of the dashed-line arrows schematically represent different current magnitudes (e.g., thicker dashed-line arrows represent greater current magnitude). The programmed state 400-1 of the PCM device 400 shown in FIG. 4B represents a lowest resistance state (or highest conductance state) of the PCM device 400 wherein the effective resistance of the PCM device 400 is primarily based on the low resistance of the crystalline region 411 which occupies the entire volume of the PCM layer 410. In the exemplary programmed state 400-1 of FIG. 4B, since the readout electrodes 430 and 440 are in direct contact with the PCM layer 410, the PCM layer 410, in effect, electrically shunts the entire resistive liner 420, such that substantially all the read current flows through the PCM layer 410, and not the resistive liner 420.

The programmed states 400-2 and 400-3 of the PCM device 400 as shown in FIGS. 4C and 4D represent intermediate resistance states (or intermediate conductance states) of the PCM device 400 which are higher in resistance (lower conductance) than the programmed state 400-1 of the PCM device 400 of FIG. 4B due to the respective amorphous regions 413 and 414 formed in the PCM layer 410. As the volume of the amorphous region increases in the PCM layer 410, the volume of the crystalline region 111 decreases in the PCM layer 110, which causes an increase in the resistance of the crystalline region 111 of the PCM layer 110 between the readout electrodes 430 and 440. As the volume of the crystalline region 411 decreases and the resistance of the crystalline region 411 of the PCM layer 410 increases, a larger portion of the read current flows through the portion of the resistive liner 420 which overlaps the PCM layer 410. In effect, the crystalline region 411 of the PCM layer 410 and the overlapping portion of the resistive liner 420 comprise parallel-connected resistors, which causes the read current to split between two current paths—one current path through the crystalline region 411 of the PCM layer 410, and another current path through the overlapping portion of the resistive liner 420, based on the resistances of the two current paths.

With the exemplary programmed states of the PCM device 400 shown in FIGS. 4C and 4D, the resistive liner layer 420 serves to electrically shunt the amorphous regions 413 and 414 such that a negligible amount of current flows through the amorphous regions 413 and 414. In this regard, for reasons discussed above, the intermediate programmed states 400-2 and 400-3 will remain stable over time, irrespective of any resistance drift of the amorphous regions 413 and 414.

The programmed state 400-4 of the PCM device 400 as shown in FIG. 4E represents a highest resistance state (or lowest conductance state) of the PCM device 400, wherein the effective resistance of the PCM device 400 is primarily based on the fixed resistance of the resistive liner 420. In particular, FIG. 4E schematically illustrates the programmed state 400-4 in which a volume of the amorphous region 415 of the PCM layer 410 is significantly large and expands an entire thickness of the PCM layer 410, thereby effectively blocking a current path from the first electrode 430 to the second electrode 440 through the PCM layer 410. As such, in this programmed state 400-4, the effective resistance of the PCM device 400 is based substantially on the fixed resistance of the resistive liner 420, wherein substantially all of the read current $I_{READ}$ flows in the current path through the resistive liner 420, with a negligible amount of current flow through the PCM layer 410. With the programmed state 400-4 of FIG. 4E, the resistive liner 420, in effect, electrically shunts the PCM layer 410. Consequently, the programmed state 400-4 will remain stable over time, irrespective of any resistance drift of the amorphous region 415.

Figure 5A:
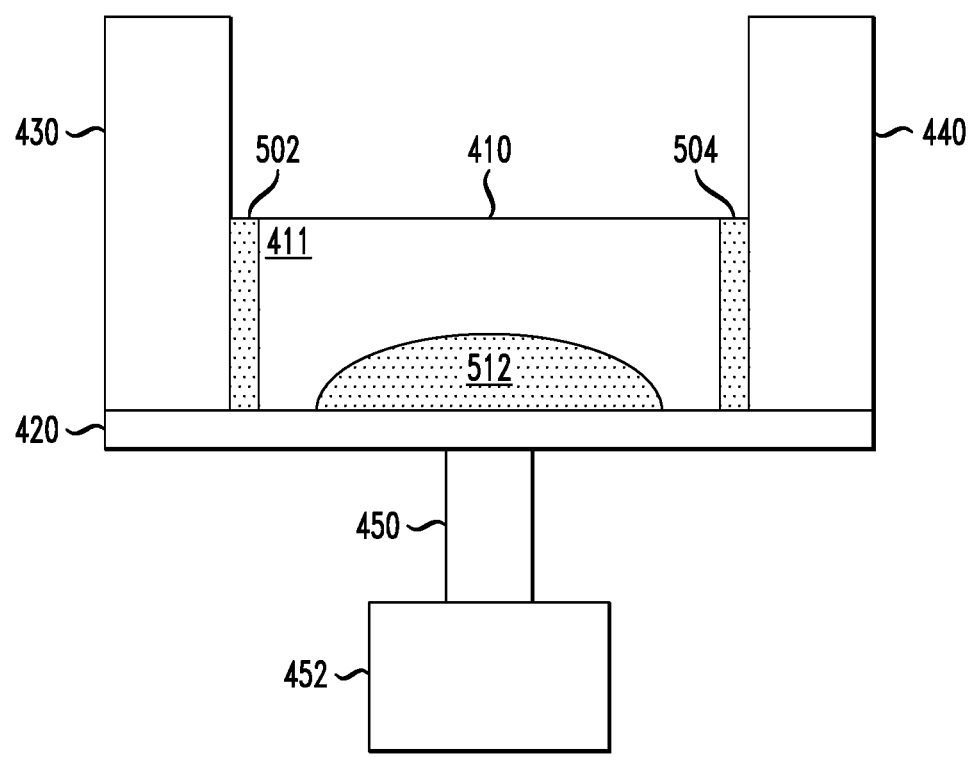
FIG. 5A schematically illustrates a PCM device which is configured to mitigate resistance drift, according to an exemplary embodiment of the disclosure.

FIG. 5A schematically illustrates a PCM device which is configured to mitigate resistance drift, according to another exemplary embodiment of the disclosure. More specifically, FIG. 5A is a schematic cross-sectional view of a PCM device 500 which is similar to the PCM device 400 of FIG. 4A, except that the PCM device 500 comprises thin insulating spacers 502 and 504 which are disposed between the sidewalls of the PCM layer 410 and the respective first and second electrodes 430 and 440. The insulating spacers 502 and 504 are formed of any insulating material, such as silicon oxide or silicon nitride, which is suitable for the given application. In this exemplary embodiment, the first and second electrodes 430 and 440 make electrical contact to the end portions of the resistive liner 420, but are insulated from the PCM layer 410. The programming and readout operations for the PCM device 500 of FIG. 4A are similar to the programing and readout operations for the PCM device 400 as discussed above in conjunction with FIGS. 4A-4E.

With the structural configuration of the PCM device 500 shown in FIG. 5A, since the first and second electrodes 430 and 440 make electrical contact only to the resistive liner 420 and not the PCM layer 410, a dome shape (or mushroom shape) of an amorphous region that is formed in the PCM layer 410 near the third (bottom) electrode 450 (e.g., amorphous region 512) will be flattened. The flattened dome shape is due to programing current being forced to flow sideways through the PCM layer 410 during programing due to the programming current flowing from the resistive liner 420 into the bottom end regions of the PCM layer 410. To minimize the series resistance of the programming current paths in the end portions of the resistive liner 420, the insulating spacers 502 and 504 can be made as thin as possible (e.g., several nanometers) to shorten the distance of such programing current paths, while providing sufficient isolation between the PCM layer 410 and the first and second electrodes 430 and 440.

Figure 5C:
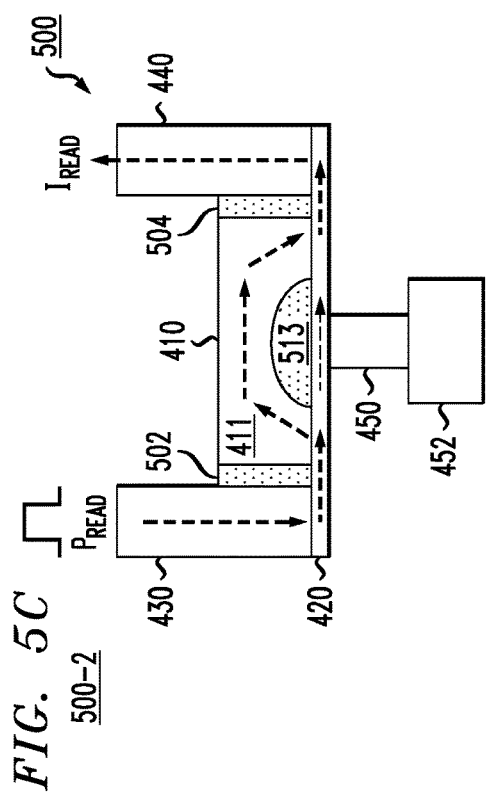
FIGS. 5B, 5C, 5D, and 5E schematically illustrate readout operations that are performed for different programmed states of the PCM device of FIG. 5A, according to an exemplary embodiment of the disclosure.
Figure 5E:
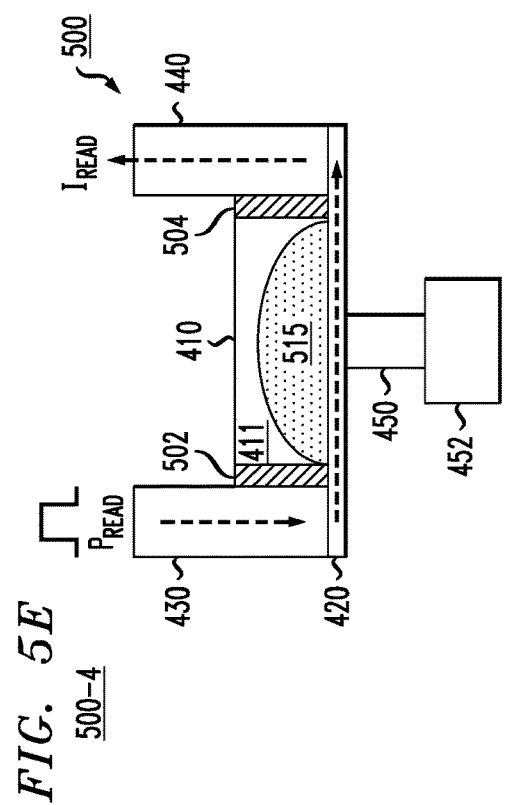
Figure 5B:
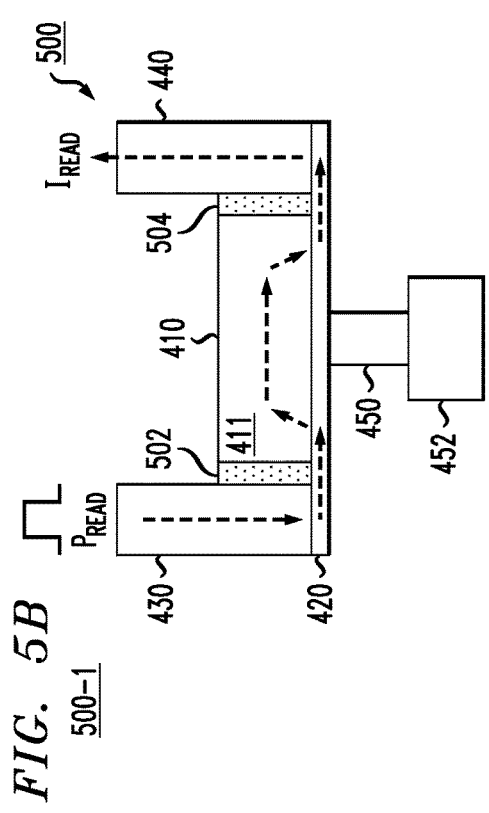
Figure 5D:
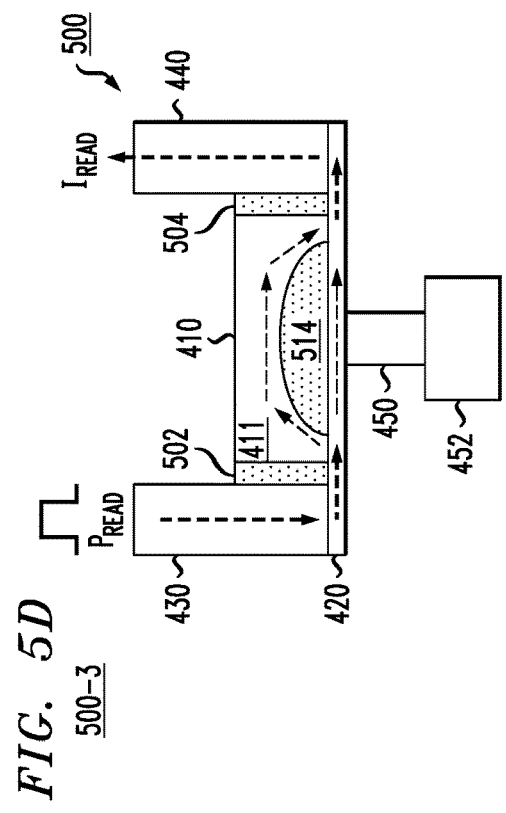

The programmed state of the PCM device 500 can be determined by placing the third electrode 450 in a floating state, and applying a read pulse to the first electrode 430 (or the second electrode 440), and determining a read current that flows out from the second electrode 440 (or the first electrode 430), wherein the magnitude of the read current is utilized to determine the programmed state of the PCM device 400. For example, FIGS. 5B, 5C, 5D, and 5E schematically illustrate readout operations that are performed for different programmed states of the PCM device 500 of FIG. 5A, according to an exemplary embodiment of the disclosure. For example, FIG. 5B schematically illustrates a programmed state 500-1 of the PCM device 500 in which an entirety of the PCM layer 410 comprises crystalline phase-change material 411, with no amorphous region. Further, FIGS. 5C, 5D, and 5E schematically illustrate respective programmed states 500-2, 500-3, and 500-4 of the PCM device 500 in which the PCM layer 410 comprises respective amorphous regions 513, 514, and 515, which are progressively larger in volume. The amorphous regions 513, 514, and 515 are formed using programming methods as discussed above, the details of which will not be repeated.

Moreover, FIGS. 5B, 5C, 5D, and 5E schematically illustrate exemplary readout operations that are performed by applying a read pulse ($P_{READ}$) to the readout electrode 430 to generate a read current ($I_{READ}$) that flows from the readout electrode 440. In the exemplary embodiments of FIGS. 5B, 5C, 5D, and 5E, the flow of read current through the PCM device 500 is illustrated by dashed-line arrows, wherein different thicknesses of the dashed-line arrows schematically represent different current magnitudes (e.g., thicker dashed-line arrows represent greater current magnitude). The programmed state 500-1 of the PCM device 500 shown in FIG. 5B represents a lowest resistance state (or highest conductance state) of the PCM device 500 wherein the effective resistance of the PCM device 500 is primarily based on the low resistance of the crystalline region 411 which occupies the entire volume of the PCM layer 410. In the exemplary programmed state 500-1 of FIG. 5B, since the readout electrodes 430 and 440 are in direct contact with only the end portions of the resistive liner 420, and not the PCM layer 410, the PCM layer 410, in effect, electrically shunts the portion of the resistive liner 420 which overlaps the PCM layer 410, such that substantially all the read current flows through the PCM layer 410 and the end portions of the resistive liner 420.

The programmed states 500-2 and 500-3 of the PCM device 500 as shown in FIGS. 5C and 5D represent intermediate resistance states (or intermediate conductance states) of the PCM device 500 which are higher in resistance (lower conductance) than the programmed state 500-1 of the PCM device 500 of FIG. 5B due to the respective amorphous regions 513 and 514 formed in the PCM layer 410. As the volume of the amorphous region increases in the PCM layer 410, the volume of the crystalline region 411 decreases in the PCM layer 410, which causes an increase in the resistance of the crystalline region 411 of the PCM layer 410. Additionally, the increasing size of the amorphous regions 513 and 514 also reduces the contact area between the crystalline region 411 and the resistive liner 420, which increases the total resistance of PCM device 500. Consequently, a larger portion of the read current flows through the portion of the resistive liner 420 which overlaps the PCM layer 410. As noted above, in effect, the crystalline region 411 of the PCM layer 410 and the overlapping portion of the resistive liner 420 comprise parallel-connected resistors, which causes the read current to split between two current paths—one current path through the crystalline region 411 of the PCM layer 410, and another current path through the overlapping portion of the resistive liner 420, based on the resistances of the two current paths.

With the exemplary programmed states of the PCM device 500 shown in FIGS. 5C and 5D, the resistive liner layer 420 serves to electrically shunt the amorphous regions 513 and 514 such that a negligible amount of current flows through the amorphous regions 513 and 514. In this regard, for reasons discussed above, the intermediate programmed states 500-2 and 500-3 will remain stable over time, irrespective of any resistance drift of the amorphous regions 513 and 514.

The programmed state 500-4 of the PCM device 500 as shown in FIG. 5E represents a highest resistance state (or lowest conductance state) of the PCM device 500, wherein the effective resistance of the PCM device 500 is primarily based on the fixed resistance of the resistive liner 420. In particular, FIG. 5E schematically illustrates the programmed state 500-4 in which a volume of the amorphous region 515 of the PCM layer 410 is significantly large and expands an entire length of the overlapping portion of the resistive liner 420. In this programmed state 500-4, the amorphous region 515 electrically isolates the resistive liner 420 from the remaining volume of the crystalline region 411 of the PCM layer 410. As such, the effective resistance of the PCM device 500 is based substantially on the fixed resistance of the resistive liner 420, wherein substantially all of the read current $I_{READ}$ flows in the current path through the resistive liner 420, with a negligible amount of current flow through the PCM layer 410. With the programmed state 500-4 of FIG. 5E, the resistive liner 420, in effect, electrically shunts the entire PCM layer 410. Consequently, the programmed state 500-4 will remain stable over time, irrespective of any resistance drift of the amorphous region 515.

Comparing the programming state 400-4 (Reset state) of the PCM device 400 shown in FIG. 4E, to the programing state 500-4 (Reset state) of the PCM device 500 of FIG. 5E, it is schematically shown that the dome-shaped amorphous region 415 in FIG. 4E spans the entire thickness, but not the entire length, of the PCM layer 410, whereas the dome-shaped amorphous region 515 in FIG. 4E spans the entire length, but not the entire thickness, of the PCM layer 410. As noted above, this is dues to the fact that the structural configuration of the PCM device 500 results in the generation of flattened dome-shaped amorphous regions during programming due to the presence of the insulating spacers 502 and 504, which cause the programming current to flow sideways and be more concentrated in the bottom region of the PCM layer near the resistive liner 420.

Figure 6A:
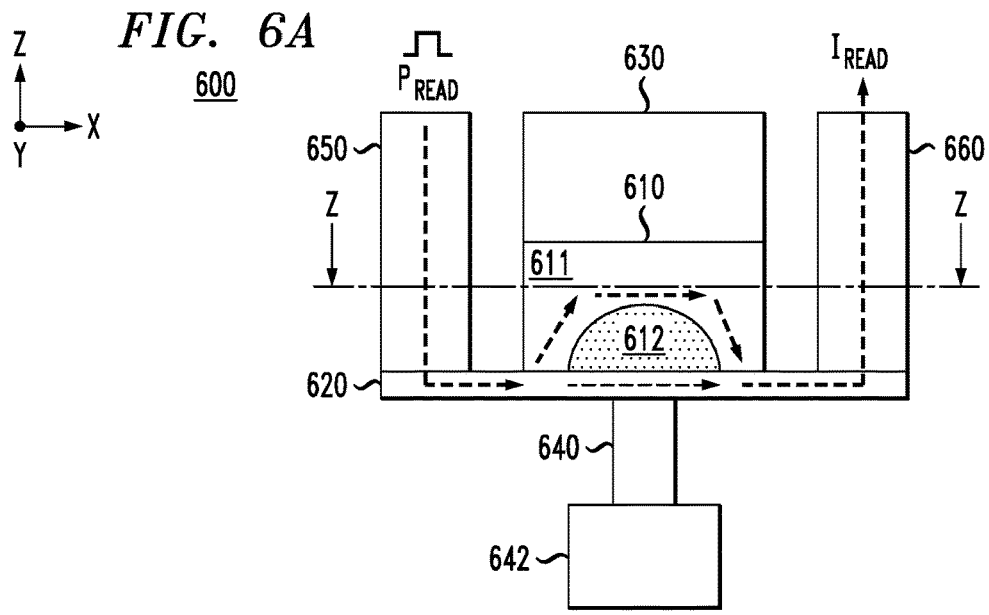
FIGS. 6A, 6B, 6C, 6D, and 6E schematically illustrate different configurations of a PCM device with resistance drift mitigation, according to other exemplary embodiments of the disclosure.

FIGS. 6A, 6B, 6C, 6D, and 6E schematically illustrate different configurations of a PCM device which is configured to mitigate resistance drift, according to other exemplary embodiments of the disclosure. In particular, FIG. 6A is a schematic cross-sectional view of a PCM device 600 which is based on the exemplary PCM structure shown in FIG. 1A, and FIGS. 6B, 6C, 6D, and 6E are schematic cross-sectional views taken long line Z-Z in FIG. 6A, which illustrate different structural configurations of elements of the PCM device 600 of FIG. 6A. As shown in FIG. 6A, the PCM device 600 comprises a PCM layer 610, a resistive liner 620, a first electrode 630, a second electrode 640, an electrode contact 642, a third electrode 650, and a fourth electrode 660. FIG. 6A illustrates an exemplary programmed state of the PCM device 600 in which the PCM layer 610 comprises a crystalline region 611 and an amorphous region 612. The fundamental structure and operation of the PCM device 600 is the same or similar to the PCM device 100 discussed above in conjunction with FIGS. 1A-1E, the details of which will not be repeated.

Figure 6B:
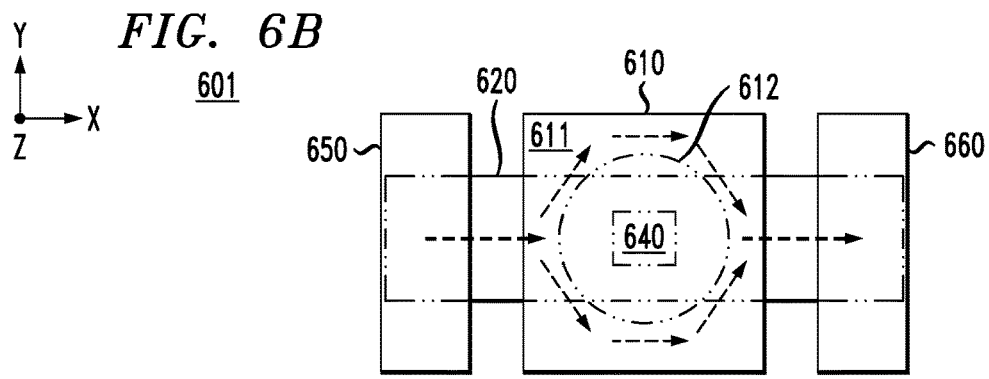

FIG. 6B is a schematic cross-sectional view of an exemplary structural configuration 601 of the PCM device 600 taken long line Z-Z in FIG. 6A, wherein the PCM layer 610, and the third and fourth electrodes 650 and 660 (e.g., readout electrodes) have widths (along the Y-direction) which are greater than a width of the resistive liner 620. In addition, the second electrode 640 is a pillar electrode which has a footprint area that is smaller than the footprint area of the PCM layer 610. With this structural configuration 601, for the intermediate resistive state shown in FIGS. 6A and 6B, the amorphous region 612 forms a dome that is schematically shown to comprise a circular-shaped footprint at a bottom periphery of the amorphous region 612 (which is in contact with the resistive liner 620), which is generated as a result of, e.g., the pillar-type structure of the second electrode 640. As such, in the PCM layer 610, the exemplary read current (shown as dashed arrows in FIGS. 6A and 6B) flows in the crystalline region 611 over a top and sides of the amorphous region 612.

Figure 6C:
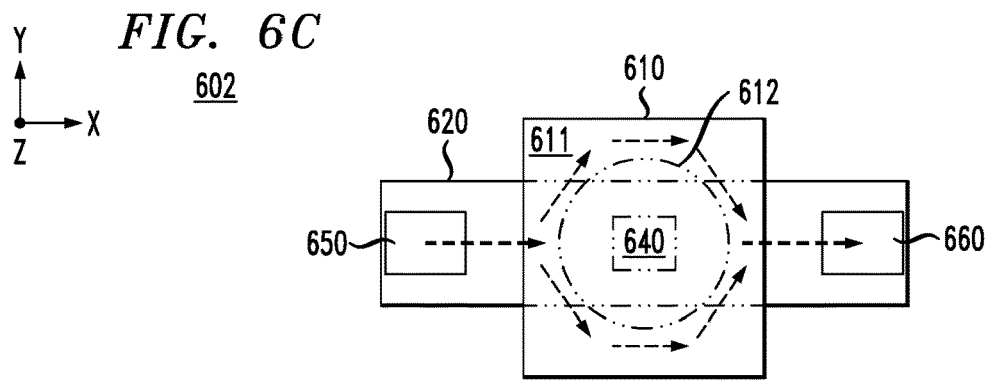

FIG. 6C is a schematic cross-sectional view of an exemplary structural configuration 602 of the PCM device 600 taken long line Z-Z in FIG. 6A. The structural configuration 602 of FIG. 6C is the same as the structural configuration 601 of FIG. 6B, except that the widths of the third and fourth electrodes 650 and 660 (along the Y-direction) are smaller than the width of the resistive liner 620. It is to be understood that the footprint sizes of the readout electrodes 650 and 660 shown in FIGS. 6B and 6C are non-limiting exemplary embodiments, and that other footprint sizes of the readout electrodes 650 and 660 may be implemented, depending on the application.

Figure 6D:
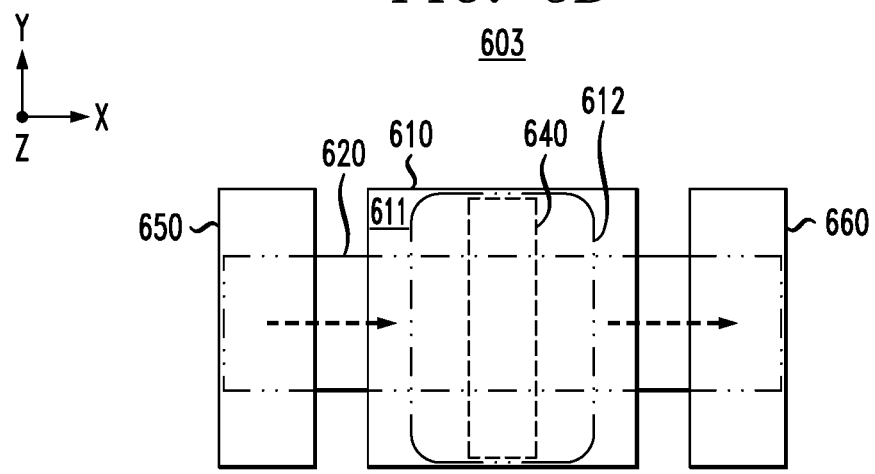

Next, FIG. 6D is a schematic cross-sectional view of an exemplary structural configuration 603 of the PCM device 600 taken long line Z-Z in FIG. 6A, wherein the PCM layer 610 and the third electrode 640 have widths (along the Y-direction) which are substantially the same. In this configuration, the second electrode 640 is a sidewall-type electrode, or rectangular-shaped electrode, which spans an entire width of the PCM layer 610. With this structural configuration 603, for the intermediate resistive state shown in FIGS. 6A and 6C, the amorphous region 612 as formed comprises a half-cylindrical shape which is schematically shown to comprise a rectangular-shaped footprint at a bottom periphery of the amorphous region 612 (which is in contact with the resistive liner 620), which is generated as a result of, e.g., the sidewall-type structure of the second electrode 640. As such, in the PCM layer 610, the exemplary read current (shown as dashed arrows in FIGS. 6A and 6D) flows in the crystalline region 611 over a top of the amorphous region 612.

Figure 6E:
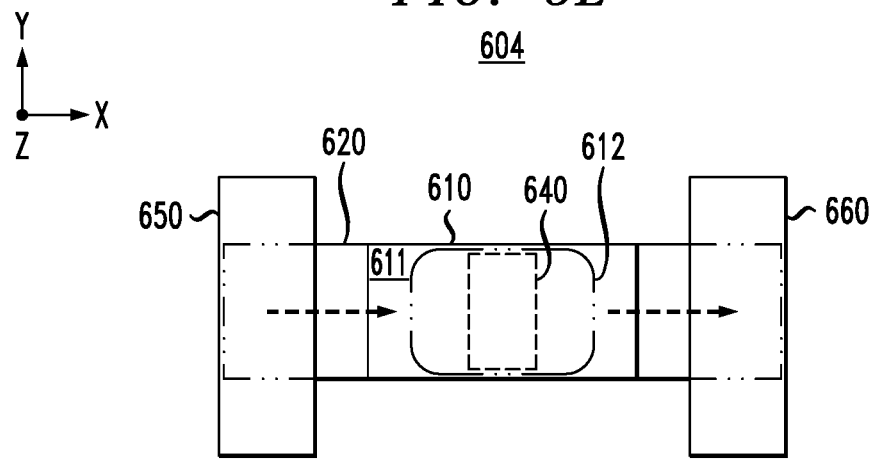

Next, FIG. 6E is a schematic cross-sectional view of an exemplary structural configuration 604 of the PCM device 600 taken long line Z-Z in FIG. 6A, wherein the PCM layer 610, the third electrode 640, and the resistive liner 620 have widths (along the Y-direction) which are substantially the same. Similar to the configuration 603 of FIG. 6D, the second electrode 640 is a sidewall-type electrode which spans an entire width of the PCM layer 610. With this structural configuration 604, for the intermediate resistive state shown in FIGS. 6A and 6E, the amorphous region 612 is schematically shown to comprise a rectangular-shaped footprint at a bottom periphery of the amorphous region 612 (which is in contact with the resistive liner 620), which is generated as a result of, e.g., the sidewall-type structure of the second electrode 640. As such, in the PCM layer 610, the exemplary read current (shown as dashed arrows in FIGS. 6A and 6E) flows (in the X-direction) in the crystalline region 611 over a top of the amorphous region 612.

As noted above, the exemplary PCM devices as disclosed herein are configured to significantly mitigate the effect of resistance drift of amorphous phase-change material, such that programmed PCM device with one or more regions of amorphous phase-change material in a PCM layer will maintain a stable programmed resistance state over time, despite resistance drift of such amorphous phase-change material. As such, the exemplary PCM devices disclosed herein can be effectively utilized as multi-level resistive memory devices for storing weights for artificial neural networks and neuromorphic computing applications, as well as storing stable matrix values of matrices in RPU arrays for performing matrix-vector multiplication operations for various applications.

Figure 7:
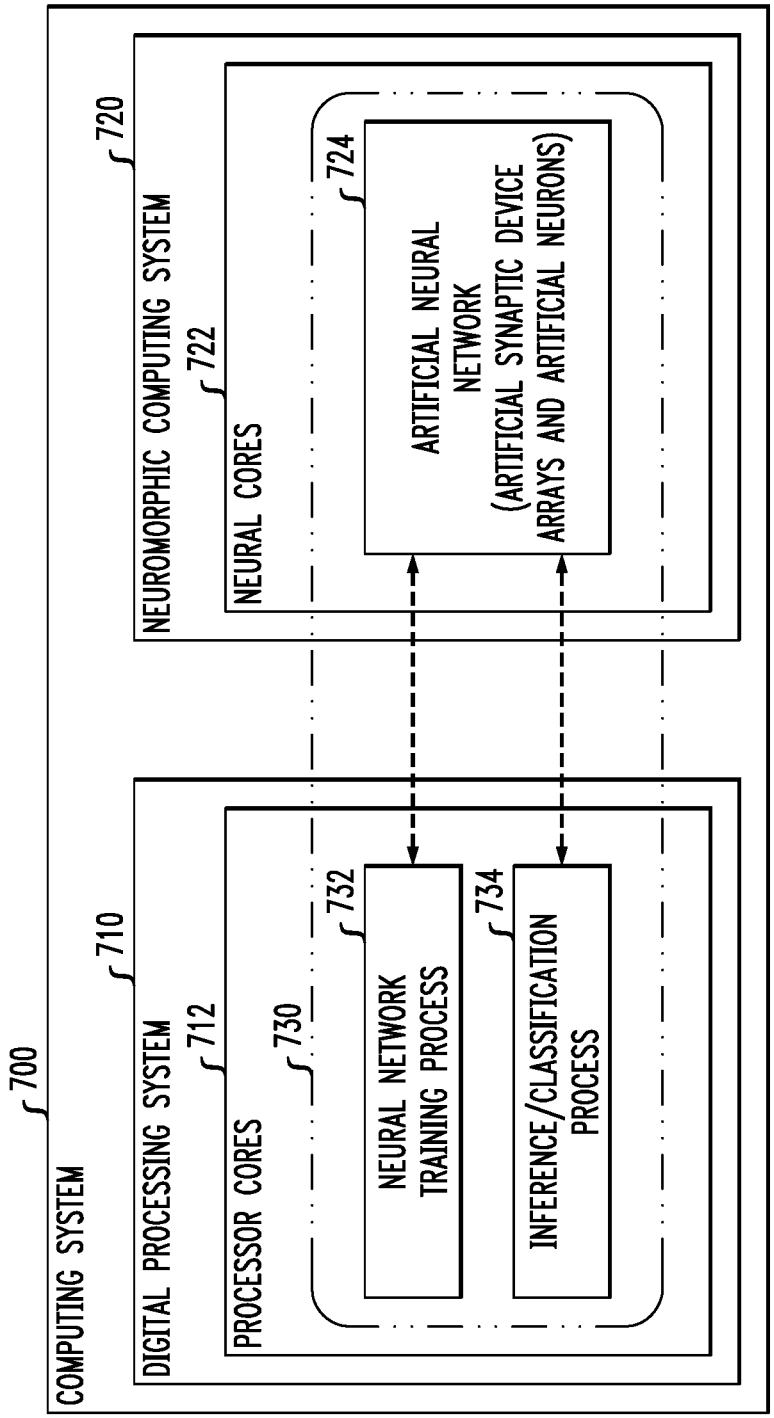
FIG. 7 schematically illustrates a system which is configured to implement PCM devices with resistance drift mitigation as resistive memory devices for neuromorphic computing, according to an exemplary embodiment of the disclosure.

FIG. 7 schematically illustrates a system which is configured to implement PCM devices with drift mitigation as resistive memory devices for neuromorphic computing, according to an exemplary embodiment of the disclosure. More specifically, FIG. 7 schematically illustrates a computing system 700 which comprises a digital processing system 710, and a neuromorphic computing system 720. The digital processing system 710 comprises a plurality of processor cores 712. The neuromorphic computing system 720 comprises a plurality of neural cores 722. In some embodiments, the neuromorphic computing system 720 comprises one or more neural cores which implement an artificial neural network 724 which comprises one or more layers of artificial neurons, wherein the neuron layers are connected by arrays of artificial synaptic devices. In some embodiments, the artificial synaptic device arrays are implemented using exemplary multi-level PCM devices with drift mitigation as described herein.

In some embodiments, the digital processing system 710 controls the execution of a process 730 which utilizes the neuromorphic computing system 720 to perform hardware accelerated computing operations. In some embodiments, the process 730 implements a neural network training process 732 to train the artificial neural network 724 which is implemented by one or more of the neural cores 722. In some embodiments, the process 730 comprises an inference/classification process 744, which utilizes a trained artificial neural network implemented in the neural cores 722 to perform pattern recognition (e.g., image recognition, face recognition, etc.).

The artificial neural network 724 can be, for example, a Deep Neural Network (DNN), a Convolutional Neural Network (CNN), a Recurrent Neural Network (RNN), a Long Short-Term Memory (LSTM) neural network, etc. Various model training methods for training such artificial neural networks are well-known to those of ordinary skill in the art. In general, a training process involves training synaptic weight matrices of an artificial neural network, wherein the synaptic weight matrices are stored in, e.g., RPU arrays of RPU devices which may be utilized to implement the neural cores 722.

For example, in some embodiments, the artificial neural network training process 732 implements a backpropagation process for training an artificial neural network model. As is known in the art, the backpropagation process comprises three repeating processes including (i) a forward process, (ii) a backward process, and (iii) a model parameter update process. During the training process, training data are randomly sampled into mini-batches, and the mini-batches are input to the model to traverse the model in two phases: forward and backward passes. The forward pass generates predictions and calculates errors between the predictions and the ground truth. The backward pass backpropagates errors through the model to obtain gradients to update model weights. The forward and backward cycles mainly involve performing matrix-vector multiplications in forward and backward directions. The weight update involves calculating a vector-vector outer product which consists of a multiplication operation and an incremental weight update to be performed locally in each resistive memory cell within a given RPU array. The processing of a given mini-batch via the forward and backward phases is referred to as an iteration, and an epoch is defined as performing the forward-backward pass through an entire training dataset. The training process iterates multiple epochs until the model converges to a convergence criterion. In some embodiments, a stochastic gradient descent (SGD) process is utilized to train artificial neural networks using the backpropagation method in which an error gradient with respect to each model parameter (e.g., weight) is calculated using the backpropagation algorithm.

Figure 8:
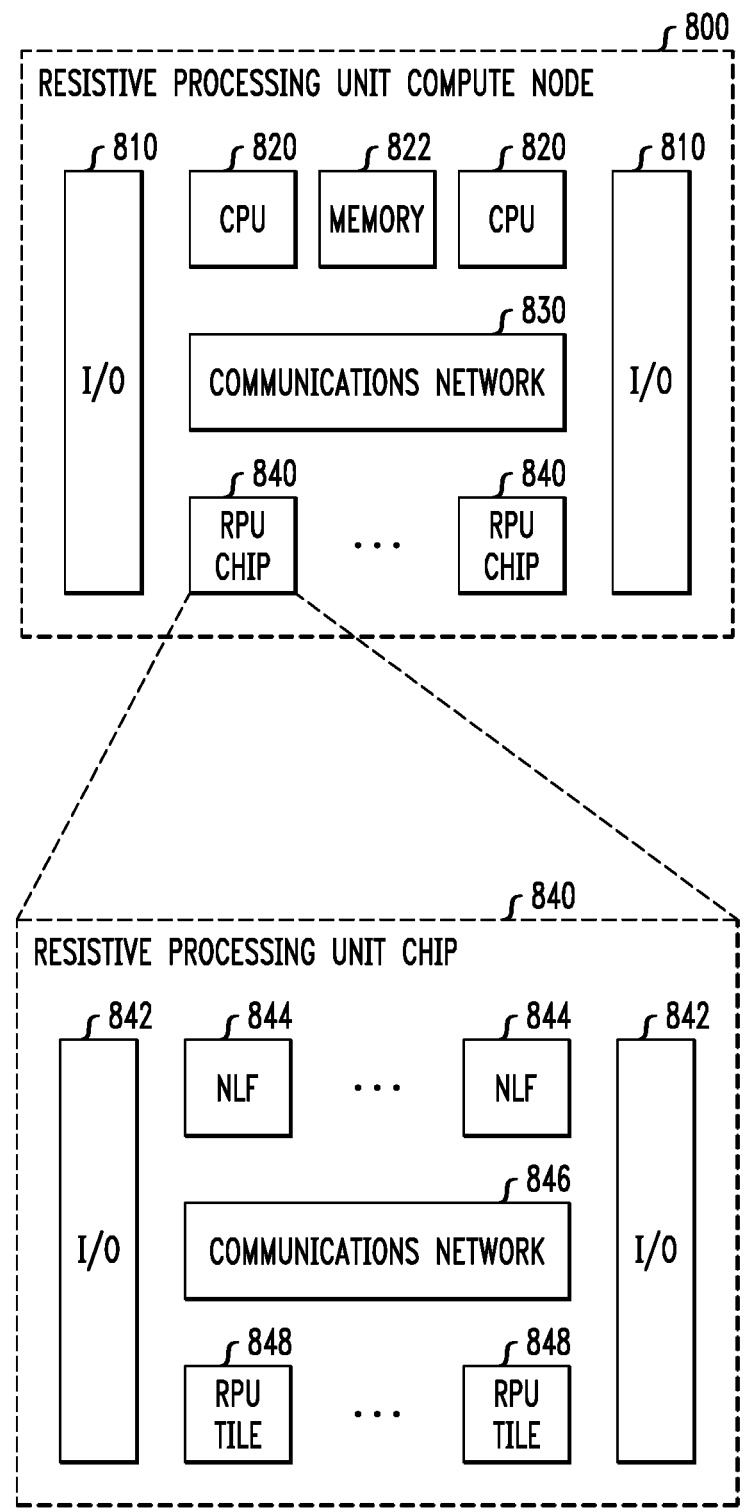
FIG. 8 schematically illustrates a resistive processing unit compute node which implements PCM devices with resistance drift mitigation for neuromorphic computing, according to an exemplary embodiment of the disclosure.

In some embodiments, the computing system 700 is implemented using an RPU computing system, an exemplary embodiment of which is shown in FIG. 8. In particular, FIG. 8 schematically illustrates a resistive processing unit compute node 800 comprising an I/O interface 810, one or more processors 820 (e.g., CPUs), memory 822 (e.g., volatile memory, and non-volatile memory), a communications network 830, and one or more RPU chips 840. In some embodiments, as shown in FIG. 8, each RPU chip 340 comprises an I/O interface 842, a plurality of non-linear function (NLF) compute modules 844, an intranode communications network 846, and a plurality of RPU tiles 848.

The I/O interface 842 comprises circuitry to enable off-chip I/O communication. Each RPU tile 848 comprises an array RPU cells (or RPU array) with peripheral circuitry. An exemplary embodiment of the RPU tiles 848 will be described in further detail below with reference to FIG. 9. For artificial neural network applications, the signals that are output from an RPU tile are directed to a non-linear function (NLF) circuit that calculates either activation functions (i.e., sigmoid, softmax) and their derivatives as well as arithmetical operations (i.e., multiplication) depending on, e.g., the given layer of the artificial neural network. For example, for neurons in hidden layers, the NLF compute modules 844 may compute a sigmoid activation function. On the other hand, neurons at an output layer, may perform a softmax NLF operation. The communications network 846 enables on-chip communication through a bus or any suitable network-on-chip (NoC) communications framework. In the exemplary embodiment of FIG. 8, the neuronal functionality is implemented by the NLF compute modules 844 using standard CMOS circuitry, while the synaptic functionality is implemented by the RPU tiles 848 which comprise densely integrated arrays or crossbars of the exemplary PCM devices with drift mitigation as discussed above.

Figure 9:
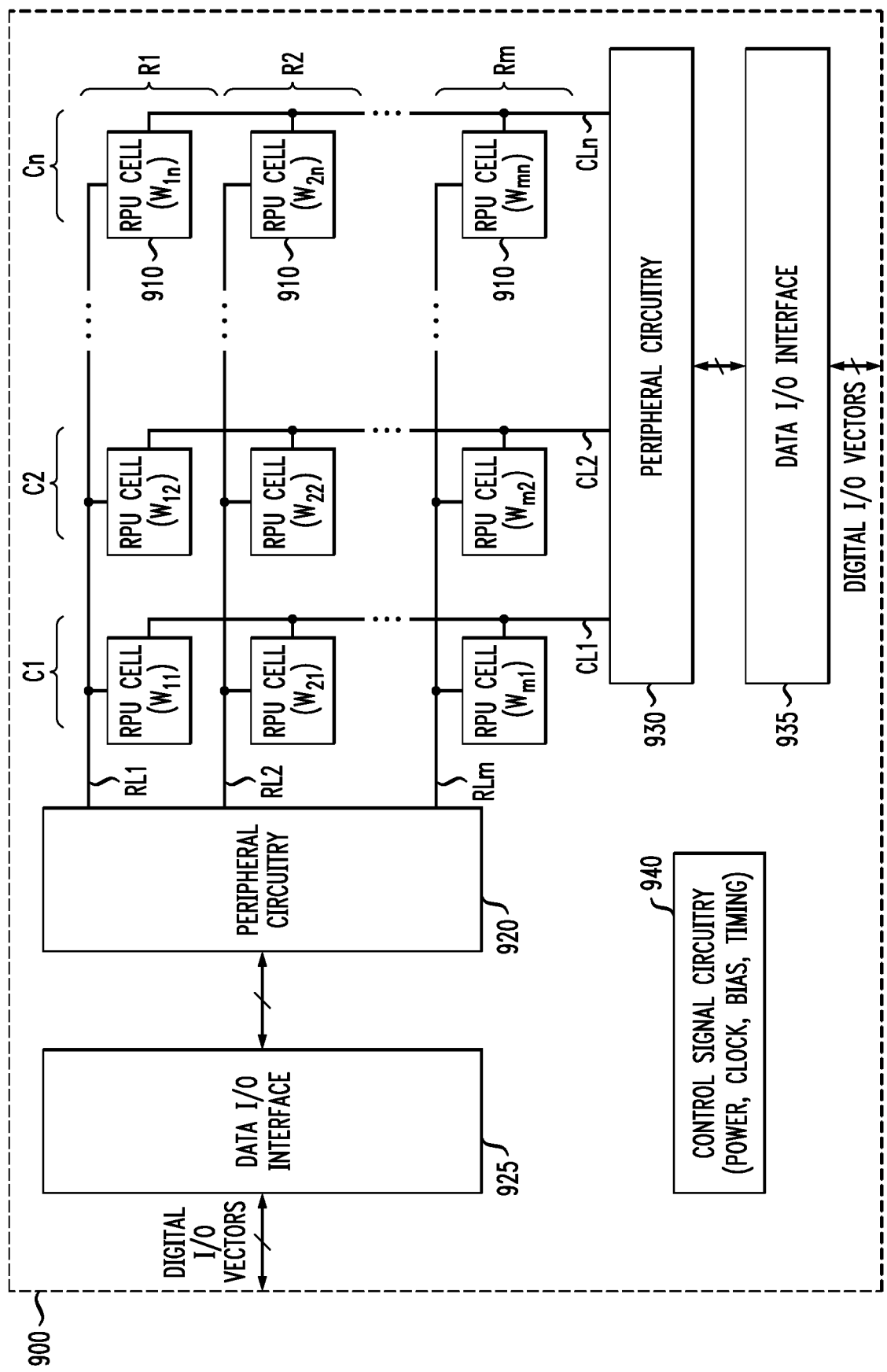
FIG. 9 schematically illustrates a resistive processing unit system which utilizes PCM devices with resistance drift mitigation to implement resistive processing unit cells, according to an exemplary embodiment of the disclosure.

FIG. 9 schematically illustrates an RPU system 900 system which utilizes PCM devices with drift mitigation to implement resistive memory devices of RPU cells, according to an exemplary embodiment of the disclosure. In some embodiments, FIG. 9 schematically illustrates an exemplary embodiment of the RPU tiles 848 of the RPU chip 840 of FIG. 8. The RPU system 900 comprises a two-dimensional (2D) crossbar array of RPU cells 910 (alternatively referred to as RPU array) arranged in a plurality of rows R1, R2, . . . , Rm, and a plurality of columns C1, C2, . . . , Cn. The RPU cells 910 in each row R1, R2, . . . , Rm are commonly connected to respective row control lines RL1, RL2, . . . , RLm (collectively, row control lines $R_L$). The RPU cells 910 in each column C1, C2, . . . , Cn are commonly connected to respective column control lines CL1, CL2, . . . , CLn (collectively, column control lines CL). Each RPU cell 910 is connected at (and between) a crosspoint (or intersection) of a respective one of the row and column control lines. In an exemplary embodiment, the number of rows (m) and the number of columns (n) are the same (i.e., n=m). For example, in some embodiments, the RPU system 900 comprises a 4,096×4,096 array of RPU cells 910.

The RPU system 900 further comprises peripheral circuitry 920 connected to the row control lines RL1, RL2, . . . , RLm, as well peripheral circuitry 930 connected to the column control lines CL1, CL2, . . . , CLn. Further, the peripheral circuitry 920 is connected to a data input/output (I/O) interface block 925, and the peripheral circuitry 930 is connected to a data I/O interface block 935. The RPU system 900 further comprises control signal circuitry 940 which comprises various types of circuit blocks such as power, clock, bias and timing circuitry to provide power distribution and control signals and clocking signals for operation of the peripheral circuitry 920 and 930.

In some embodiments, each RPU cell 910 in the RPU system 900 comprises a PCM device with drift mitigation (as discussed herein) to implement a multi-level resistive memory element with a desire range of tunable conductance values. For an artificial neural network model, the RPU cells 910 in the given RPU array comprise respective conductance values that are mapped to respective synaptic weight values of a weight matrix W for a given layer of the artificial neural network model, which is stored in the array of RPU cells 910. While the RPU cells 910 are generically depicted in FIG. 9, it is to be understood that in some embodiments, each RPU cell 910 would comprise, e.g., at least one PCM device, and at least one access device (e.g., select transistor) to implement, e.g., a 1T-1R RPU cell.

Moreover, while the row control lines $R_L$ and column control lines CL are each shown in FIG. 9 as a single line for ease of illustration, it is to be understood that each row and column control line can include two or more control lines connected to the RPU cells 910 in the respective rows and columns, depending on the implementation and the specific architecture of the RPU cells 910. For example, in some embodiments, for a four-terminal PCM device such as shown in FIGS. 1A, 2A, and 4, each row control line $R_L$ may include a pair of control lines, e.g., a programming control line coupled to a first programming terminal of the PCM device, and a readout control line coupled to a first readout terminal of the PCM device, as well as one or more word lines to activate one or more select transistors in the given RPU cell 910. Moreover, each column control line CL may comprise multiple control lines including, e.g., a programming control line coupled to a second programming terminal of the PCM device, and a readout control line coupled to a second readout terminal of the PCM device, etc. The particular architecture of the RPU cells 910 can vary depending on the structure of the PCM devices (e.g., four or three terminal devices) and the access/select circuitry that is implemented in RPU cells.

The peripheral circuitry 920 and 930 comprises various circuit blocks which are connected to the respective rows and columns in the 2D array of RPU cells 910, and which are configured to perform various programming and readout operations for PCM devices as discussed above, as well as perform various analog, in-memory computation operations such as vector-matrix multiply functions, matrix-vector multiply functions, and outer product update operations, etc., to provide hardware accelerated computation operations as discussed herein. For example, in some embodiments, to support RPU cell read/sensing operations (e.g., read a weight value of a given RPU cell 910), the peripheral circuitry 920 and 930 may comprise pulse-width modulation (PWM) circuitry and read pulse driver circuitry, which is configured to generate and apply PWM read pulses to the RPU cells 910 in response to digital input vector values (read input values) received during different operations. More specifically, in some embodiments, the peripheral circuitry 920 and 930 comprises digital-to-analog (D/A) converter circuitry that is configured to receive a digital input vector (to be applied to rows or columns) and convert the elements of the digital input vector into analog input vector values that are represented by input voltage voltages of varying pulse width. In some embodiments, a time-encoding scheme is used when input vectors are represented by fixed amplitude Vin=1 V pulses with a tunable duration (e.g., pulse duration is a multiple of 1 ns and is proportional to the value of the input vector). The input voltages applied to rows (or columns) generate output vector values which are represented by output currents, wherein the stored weights/values of the RPU cells 910 are essentially read out by measuring the output currents (e.g., read currents $I_{READ}$).

The peripheral circuitry 920 and 930 further comprises current integrator circuitry and analog-to-digital (A/D) converter circuitry to integrate read currents ($I_{READ}$) which are output and accumulated from the connected RPU cells 910 and convert the integrated currents into digital values (read output values) for subsequent computation. In particular, the currents generated by the RPU cells 910 are summed on the columns (or rows) and the summed current is integrated over a measurement time, $T_{MEAS}$, by current readout circuitry of the peripheral circuitry 920 and 930. The current readout circuitry comprises current integrators and analog-to-digital (A/D) converters. In some embodiments, each current integrator comprises an operational amplifier that integrates the current output from a given column (or row) (or differential currents from pairs of RPU cells implementing negative and positive weights) on a capacitor, and an analog-to-digital (A/D) converter converts the integrated current (e.g., an analog value) to a digital value.

The data I/O interfaces 925 and 935 are configured to interface with a digital processing core, wherein the digital processing core is configured to process input/outputs to the RPU system 900 (e.g., neural core) and route data between different RPU arrays. The data I/O interfaces 925 and 935 are configured to (i) receive external control signals and data from a digital processing core and provide the received control signals and data to the peripheral circuitry 920 and 930, and (ii) receive digital read output values from peripheral circuitry 920 and 930, and send the digital read output values to a digital processing core for processing. In some embodiments, as noted above, the digital processing cores implement non-linear function circuitry which calculates activation functions (e.g., sigmoid neuron function, softmax, etc.) and other arithmetical operations on data that is to be provided to a next or previous layer of an artificial neural network.

The RPU system 900 of FIG. 9 can be configured to operate as an in-memory computing system or computational memory system in which an RPU array is utilized for a dual purpose of storing data and processing the data to perform some computational tasks. As noted above, neuromorphic computing systems and artificial neural network systems are types of in-memory computing systems in which artificial neurons are connected using artificial synaptic devices to provide synaptic weights which represent the strength of connection between two artificial neurons. The synaptic weights can be implemented using tunable resistive memory devices, wherein the variable conductance states are used to represent the synaptic weights and to perform computations (e.g., matrix-vector multiplication operations). The conductance states of the analog resistive memory devices are encoded or otherwise mapped to synaptic weights.

More specifically, in an exemplary embodiment, the array of RPU cells 910 of the RPU system 900 of FIG. 9 comprise artificial synaptic devices which connect artificial pre-synaptic neurons (e.g., artificial neurons of an input layer or hidden layer of the artificial neural network) and artificial post-synaptic neurons (e.g., artificial neuron of a hidden layer or output layer of the artificial neural network), wherein the artificial synaptic devices provide synaptic weights that represent connection strengths between the pre-synaptic and post-synaptic neurons. As shown in FIG. 9, the weights Wij (where i denotes the row index and j denotes the column index) are in the form of a matrix. For example, in some embodiments, for convolutional neural networks, the weights Wij correspond to kernel parameters of a kernel matrix that is stored in the array of RPU cells 910.

When training an artificial neural network that is implemented (at least in part) using an array of RPU cells such as shown in FIG. 9, as data moves forward through the network, matrix-vector multiplication operations are performed, wherein the hidden neurons/nodes take the inputs, perform a non-linear transformation, and then send the results to the next weight matrix. This process continues until the data reaches the output neurons/nodes. The output neurons/nodes evaluate the classification error, and then propagate this classification error back in a manner similar to the forward pass, which results in a matrix-vector multiplication operations being performed in the opposite direction. For each data set, when the forward pass and backward pass are completed, a weight update is performed. Essentially, each weight will be updated proportionally to the input to that weight as defined by the input neuron/node and the error computed by the neuron/node to which it is connected. As noted above, the exemplary PCM devices with drift mitigation are well adapted for use as multi-level resistive memory devices for implementing artificial synaptic devices for artificial neural network applications.

Exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
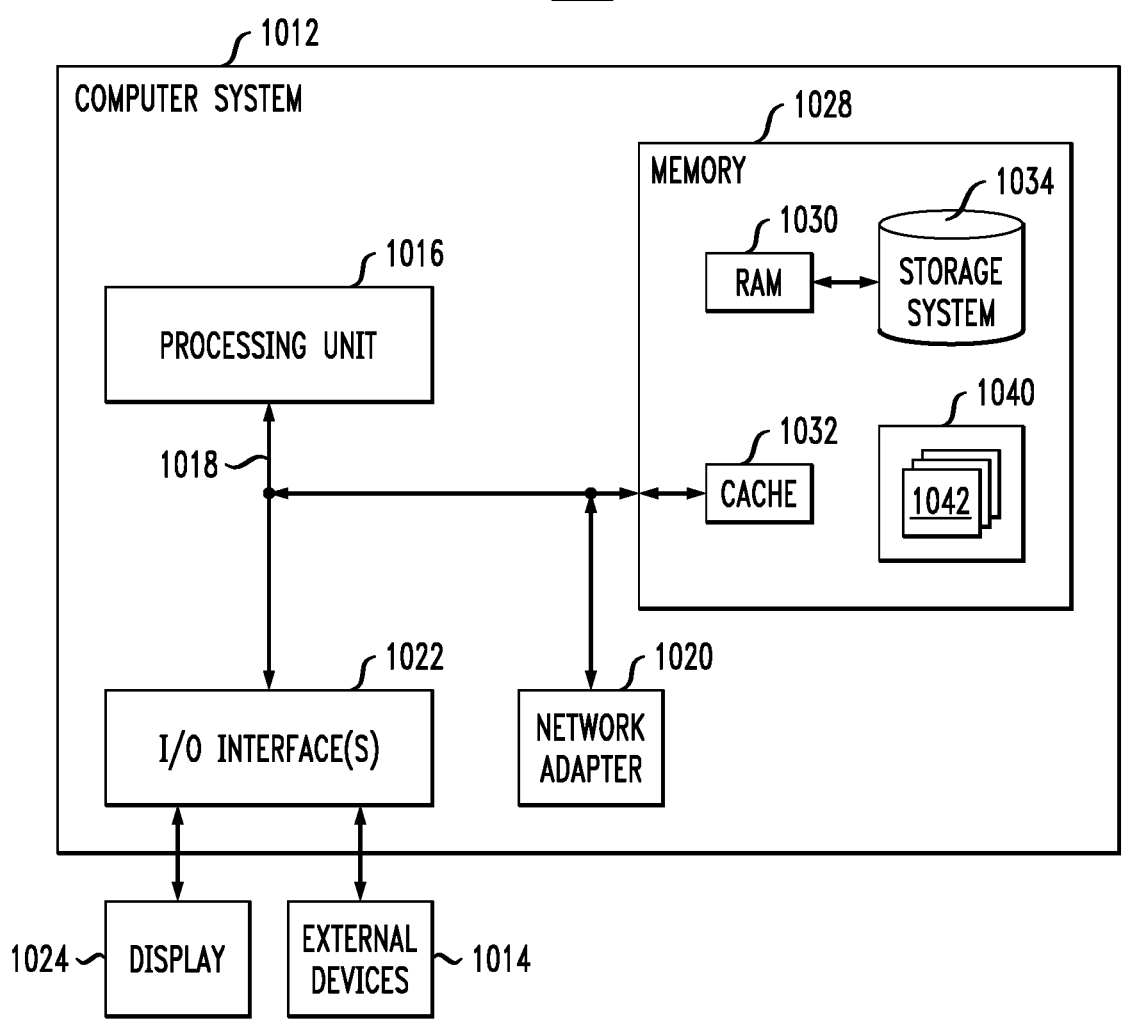
FIG. 10 schematically illustrates an exemplary architecture of a computing node which can host the system of FIG. 7, according to an exemplary embodiment of the disclosure.

These concepts are illustrated with reference to FIG. 10, which schematically illustrates an exemplary architecture of a computing node that can host the computing system of FIG. 7, according to an exemplary embodiment of the disclosure. FIG. 10 illustrates a computing node 1000 which comprises a computer system/server 1012, which is operational with numerous other general purpose or special purpose computing system environments or configurations. Examples of well-known computing systems, environments, and/or configurations that may be suitable for use with computer system/server 1012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1012 may be practiced in distributed cloud computing environments where tasks are performed by remote processing devices that are linked through a communications network. In a distributed cloud computing environment, program modules may be located in both local and remote computer system storage media including memory storage devices.

In FIG. 10, computer system/server 1012 in computing node 1000 is shown in the form of a general-purpose computing device. The components of computer system/server 1012 may include, but are not limited to, one or more processors or processing units 1016, a system memory 1028, and a bus 1018 that couples various system components including system memory 1028 to the processors 1016.

The bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1012 typically includes a variety of computer system readable media. Such media may be any available media that is accessible by computer system/server 1012, and it includes both volatile and non-volatile media, removable and non-removable media.

The system memory 1028 can include computer system readable media in the form of volatile memory, such as random-access memory (RAM) 1030 and/or cache memory 1032. The computer system/server 1012 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1018 by one or more data media interfaces. As depicted and described herein, memory 1028 may include at least one program product having a set (e.g., at least one) of program modules that are configured to carry out the functions of embodiments of the invention.

The program/utility 1040, having a set (at least one) of program modules 1042, may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1042 generally carry out the functions and/or methodologies of embodiments of the disclosure as described herein.

Computer system/server 1012 may also communicate with one or more external devices 1014 such as a keyboard, a pointing device, a display 1024, etc., one or more devices that enable a user to interact with computer system/server 1012, and/or any devices (e.g., network card, modem, etc.) that enable computer system/server 1012 to communicate with one or more other computing devices. Such communication can occur via Input/Output (I/O) interfaces 1022. Still yet, computer system/server 1012 can communicate with one or more networks such as a local area network (LAN), a general wide area network (WAN), and/or a public network (e.g., the Internet) via network adapter 1020. As depicted, network adapter 1020 communicates with the other components of computer system/server 1012 via bus 1018. It should be understood that although not shown, other hardware and/or software components could be used in conjunction with computer system/server 1012. Examples, include, but are not limited to: microcode, device drivers, redundant processing units, external disk drive arrays, RAID systems, SSD drives, and data archival storage systems, etc.

Additionally, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider.

The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 11:
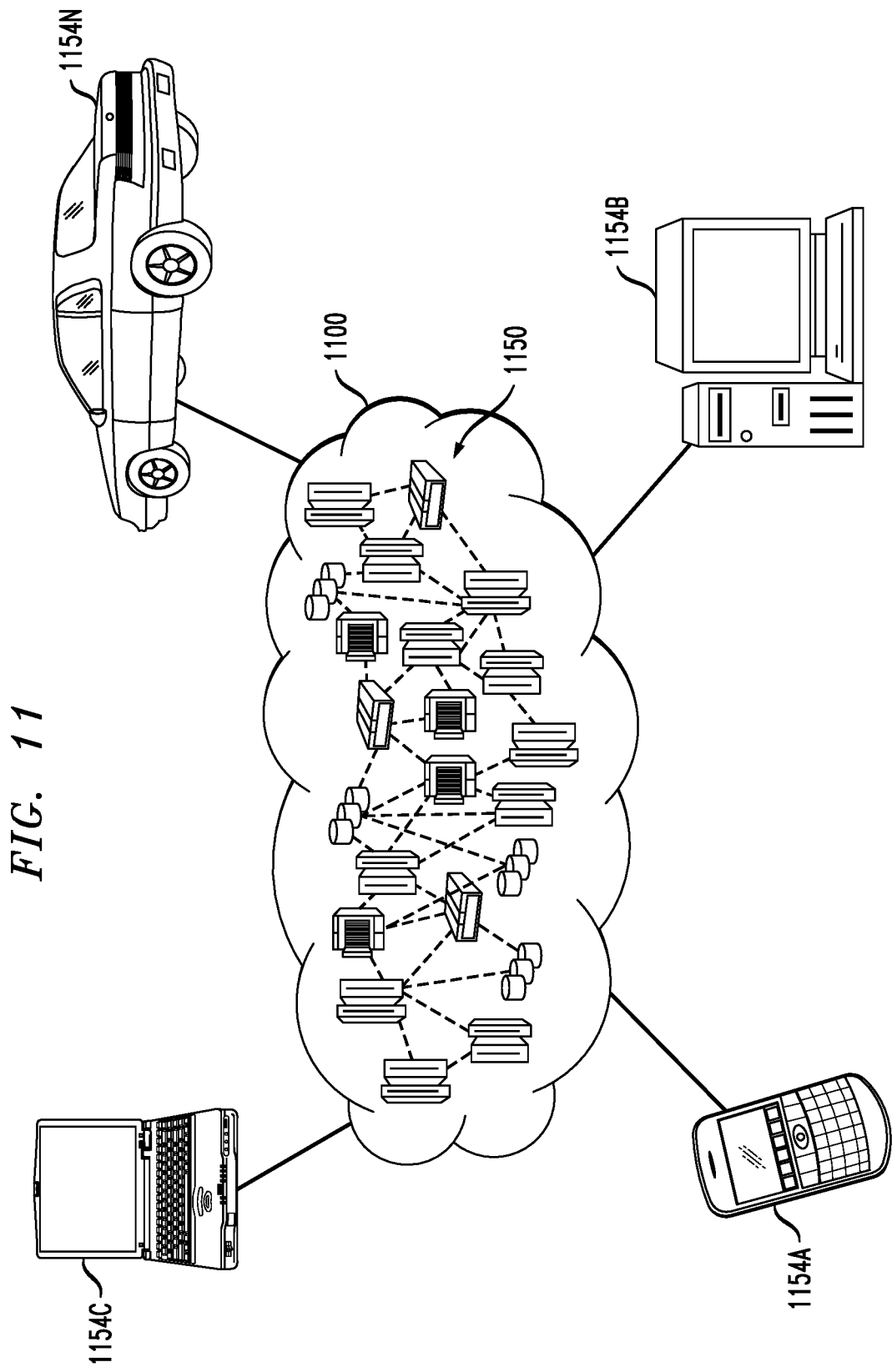
FIG. 11 depicts a cloud computing environment according to an exemplary embodiment of the disclosure.

Referring now to FIG. 11, illustrative cloud computing environment 1100 is depicted. As shown, cloud computing environment 1100 includes one or more cloud computing nodes 1150 with which local computing devices used by cloud consumers, such as, for example, personal digital assistant (PDA) or cellular telephone 1154A, desktop computer 1154B, laptop computer 1154C, and/or automobile computer system 1154N may communicate. Nodes 1150 may communicate with one another. They may be grouped (not shown) physically or virtually, in one or more networks, such as Private, Community, Public, or Hybrid clouds as described hereinabove, or a combination thereof. This allows cloud computing environment 1100 to offer infrastructure, platforms and/or software as services for which a cloud consumer does not need to maintain resources on a local computing device. It is understood that the types of computing devices 1154A-N shown in FIG. 11 are intended to be illustrative only and that computing nodes 1150 and cloud computing environment 1100 can communicate with any type of computerized device over any type of network and/or network addressable connection (e.g., using a web browser).

Figure 12:
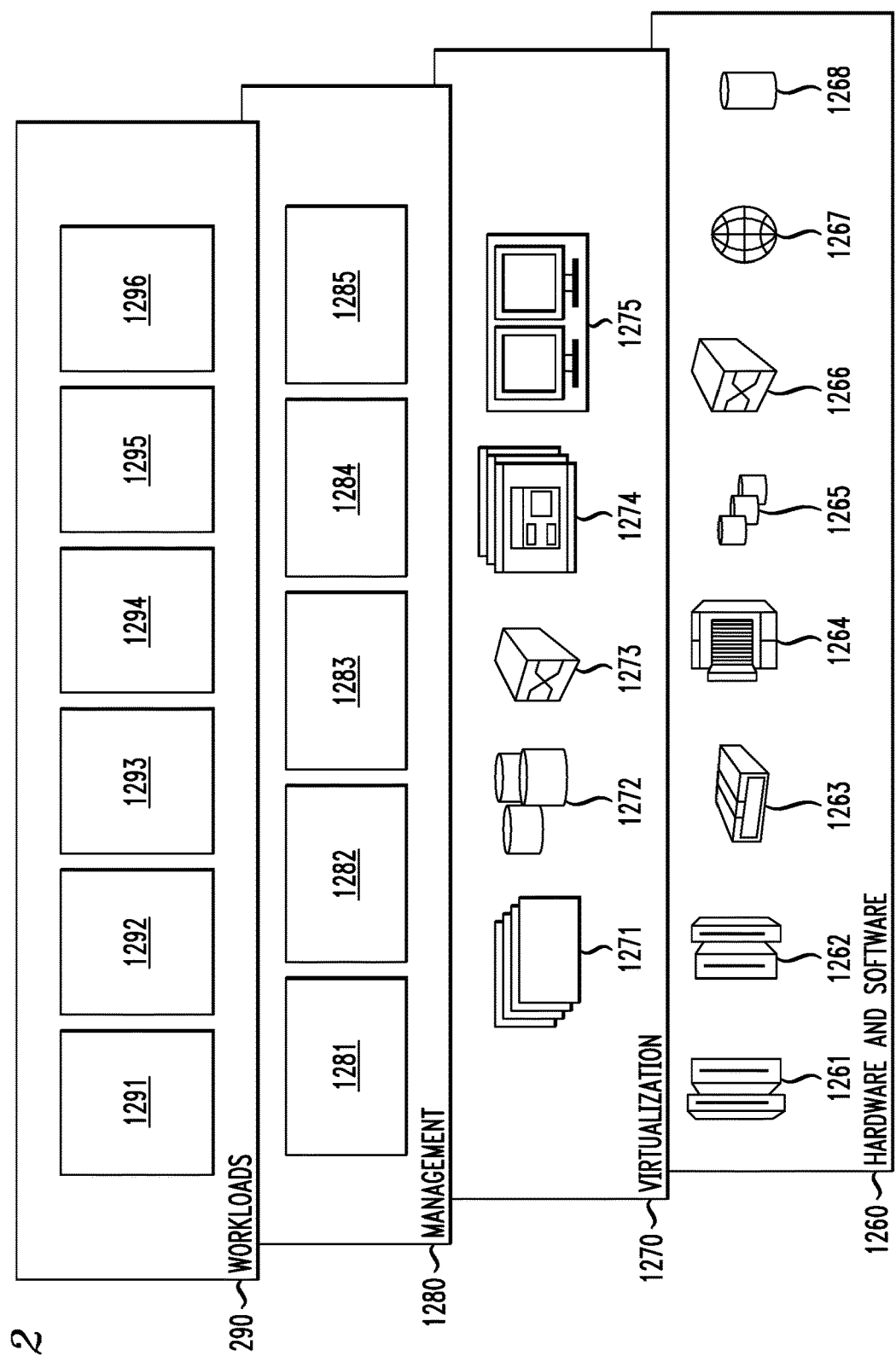
FIG. 12 depicts abstraction model layers according to an exemplary embodiment of the disclosure.

Referring now to FIG. 12, a set of functional abstraction layers provided by cloud computing environment 1100 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 1260 includes hardware and software components. Examples of hardware components include: mainframes 1261; RISC (Reduced Instruction Set Computer) architecture based servers 1262; servers 1263; blade servers 1264; storage devices 1265; and networks and networking components 1266. In some embodiments, software components include network application server software 1267 and database software 1268.

Virtualization layer 1270 provides an abstraction layer from which the following examples of virtual entities may be provided: virtual servers 1271; virtual storage 1272; virtual networks 1273, including virtual private networks; virtual applications and operating systems 1274; and virtual clients 1275.

In one example, management layer 1280 may provide the functions described below. Resource provisioning 1281 provides dynamic procurement of computing resources and other resources that are utilized to perform tasks within the cloud computing environment. Metering and Pricing 1282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1283 provides access to the cloud computing environment for consumers and system administrators. Service level management 1284 provides cloud computing resource allocation and management such that required service levels are met. Service Level Agreement (SLA) planning and fulfillment 1285 provide pre-arrangement for, and procurement of, cloud computing resources for which a future requirement is anticipated in accordance with an SLA.

Workloads layer 1290 provides examples of functionality for which the cloud computing environment may be utilized. Examples of workloads and functions which may be provided from this layer include: mapping and navigation 1291; software development and lifecycle management 1292; virtual classroom education delivery 1293; data analytics processing 1294; transaction processing 1295; and various functions 1296 for performing training of artificial neural networks, as well as inference/classification using trained artificial neural networks, as discussed above in conjunction with, e.g., FIG. 7. Furthermore, in some embodiments, the hardware and software layer 1260 would include, e.g., the computing system 700 of FIG. 7 to implement or otherwise support the various workloads and functions 1096 for performing artificial neural network training processes, and inference/classification processes using the trained artificial neural networks, etc.

Figure 13A:
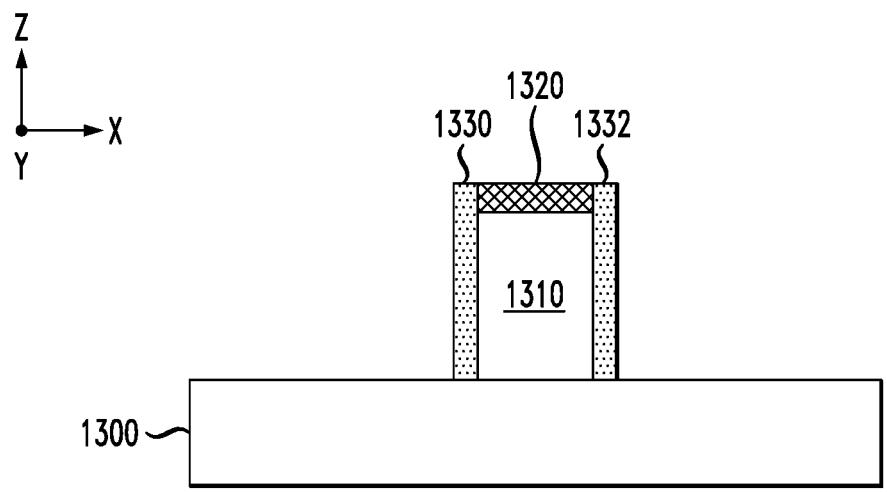
FIGS. 13A, 13B, 13C, 13D, 13E, 13F, 13G, and 13H schematically illustrate a process for fabricating a PCM device with resistance drift mitigation, according to an exemplary embodiment of the disclosure.
Figure 13B:
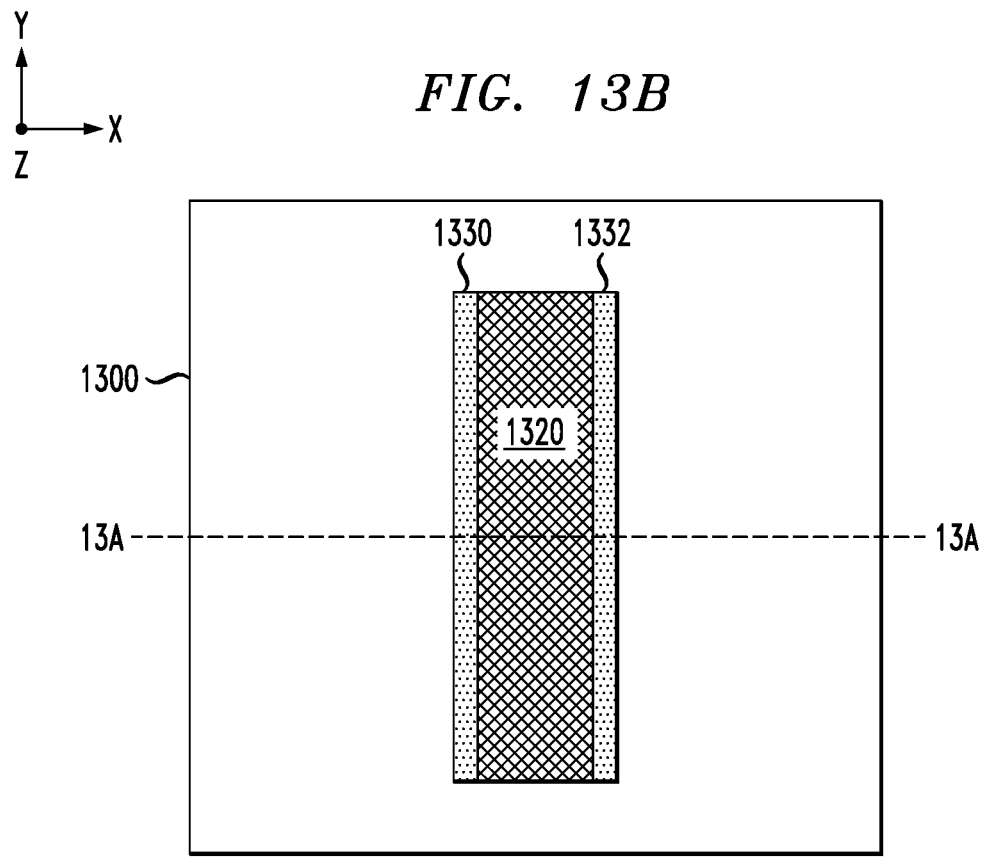

FIGS. 13A, 13B, 13C, 13D, 13E, 13F, 13G, and 13H schematically illustrate a process for fabricating a PCM device with resistance drift mitigation, according to an exemplary embodiment of the disclosure. To begin, FIGS. 13A and 13B are schematic views of a PCM device at an initial stage of fabrication, wherein FIG. 13A is a schematic cross-sectional side view (X-Z plane) of the PCM device taken along line 13A-13A in FIG. 13B, and wherein FIG. 13B is a schematic top plan view (X-Y plane) of the PCM device shown in FIG. 13A. As shown in FIGS. 13A and 13B, at the initial stage of fabrication, the PCM device comprises a first insulating layer 1300, a PCM element 1310 formed on a surface of the first insulating layer 1300, a hard mask layer 1320 disposed on an upper surface of the PCM element 1310, a first resistive liner 1330 formed on a first sidewall surface of the PCM element 1310, and a second resistive liner 1332 formed on a second sidewall surface of the PCM element 1310.

In some embodiments, the first insulating layer 1300 is formed of a silicon nitride material, although it is to be understood that the first insulating layer 1300 can be formed of other suitable types of insulating/dielectric materials. In some embodiments, the PCM element 1310 is formed by a process which comprises, e.g., (i) depositing a layer of phase-change material on the surface of the first insulating layer 1300, (ii) forming a layer of hard mask material on the layer of phase-change material, (iii) patterning the layer of hard mask material to form the hard mask layer 1320 which comprise an image of the PCM element 1310, and (iv) performing an etch process using the hard mask layer 1320 as etch mask to selectively etch exposed portions of the phase-change material down to the surface of the first insulating layer 1300 to thereby form the elongated PCM element 1310. In some embodiments, as noted above, the PCM element 1310 is formed of a chalcogenide alloy of germanium, antimony, and tellurium. In some embodiments, the hard mask layer 1320 is formed of a silicon nitride material.

In some embodiments, the first and second resistive liners 1330 and 1332 are formed by a process which comprises, e.g., (i) depositing a conformal layer of resistive material over the surface of the first insulating layer 1300, and conformally covering the surface of the hard mask layer 1320 and the exposed sidewalls of the PCM element 1310, (ii) performing an anisotropic etch process (e.g., reactive ion etch (RIE) process) to etch away portions of the conformal layer of resistive material on horizontal surfaces and maintain the resistive material on the vertical sidewalls of the PCM element 1310, and (iii) performing a trimming process to remove portions of the conformal layer of resistive material on the vertical sidewall surfaces at the ends of the elongated PCM element 1310. The process flow results in the intermediate device structure shown in FIGS. 13A and 13B with the separate first and second resistive liners 1330 and 1332 formed the opposing first and second sidewall surfaces of the PCM element 1310.

The first and second resistive liners 1330 and 1332 can be formed of the same or similar materials as discussed above, e.g., tantalum nitride, a doped carbon material (e.g., hydrogen-doped carbon), a conducting oxide material, or any other suitable electrically conductive materials, etc. In some embodiments, the conformal layer of resistive material (e.g., TaN) is deposited using a deposition process, such as atomic layer deposition (ALD) which forms a highly conformal layer of resistive material.

Figure 13C:
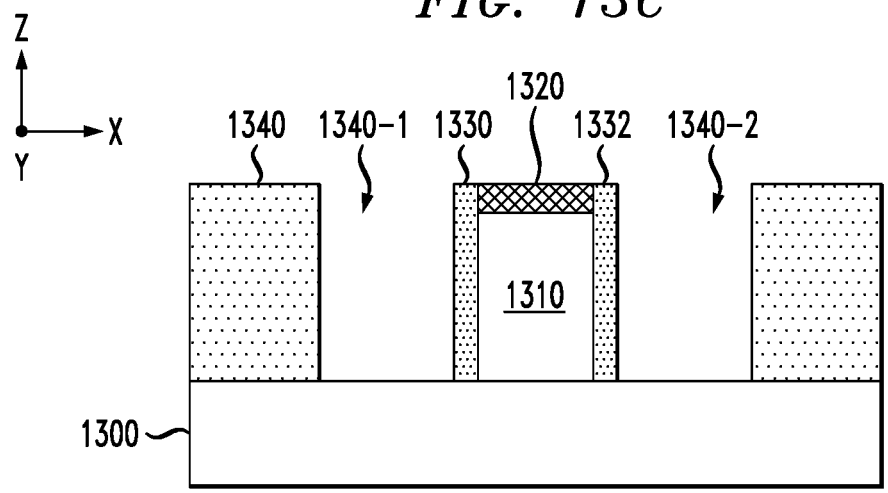
Figure 13D:
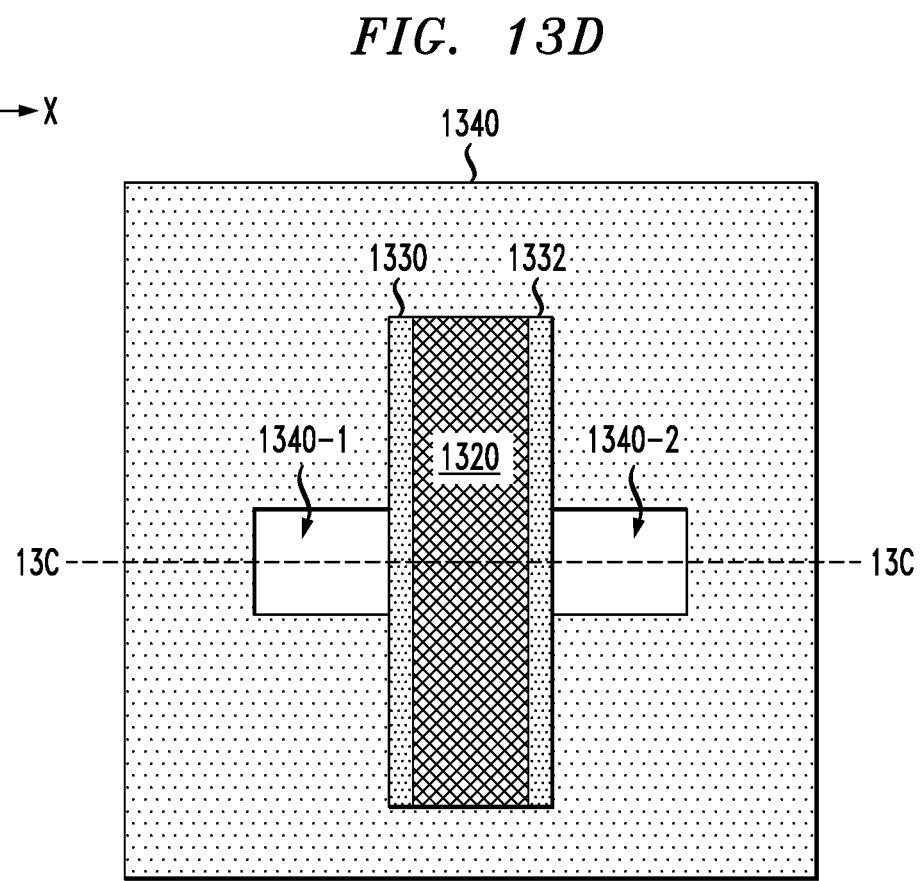

Next, FIGS. 13C and 13D are schematic views of the PCM device at an intermediate stage of fabrication, wherein FIG. 13C is a schematic cross-sectional side view (X-Z plane) of the PCM device taken along line 13C-13C in FIG. 13D, and wherein FIG. 13D is a schematic top plan view (X-Y plane) of the PCM device shown in FIG. 13C. As shown in FIGS. 13C and 13D, the intermediate structure further comprises a second insulating layer 1340, and first and second trenches 1340-1 and 1340-2 formed in the second insulating layer 1340 adjacent to the first and second resistive liners 1330 and 1332. In some embodiments, the second insulating layer 1340 comprises any suitable insulating/dielectric material including, but not limited to, silicon oxide, silicon nitride, silicon oxynitride, or other types of silicon-based low-k dielectrics, or ULK (ultra-low-k) dielectric materials.

In some embodiments, the second insulating layer 1340 is formed by depositing a blanket layer of dielectric/insulating material over the intermediate device structure shown in FIGS. 13A and 13B, and planarizing the layer of dielectric/insulating material down to the hard mask layer 1320 to thereby form the planarized second insulating layer 1340. The dielectric/insulating material is deposited using known deposition techniques such as chemical vapor deposition (CVD), plasma-enhanced CVD (PECVD), physical vapor deposition (PVD), etc. In some embodiments, layer of dielectric/insulating material is planarized using a standard planarization process (e.g., a chemical-mechanical planarization (CMP) process).

In some embodiments, the first and second trenches 1340-1 and 1340-2 are formed in the second insulating layer 1340 using a photolithographic patterning process. For example, an exemplary photolithographic patterning process is performed by (i) forming photoresist mask over the planarized surface of the second insulating layer 1340, wherein the photoresist mask comprises openings which define images of the first and second trenches 1340-1 and 1340-2, and (ii) using the photoresist mask to etch exposed portions of the second insulating layer 1340 down to the surface of the first insulating layer 1300 to thereby form the trenches 1340-1 and 1340-2, which also exposed portions of the first and second resistive liners 1330 and 133. The photolithographic patterning process enables a precise self-alignment of the trenches 1340-1 and 1340-2 on opposing sides of the PCM element 1310. The trenches 1340-1 and 1340-2 are subsequently filled with metallic material to form first and second programming electrodes of the PCM device.

Figure 13E:
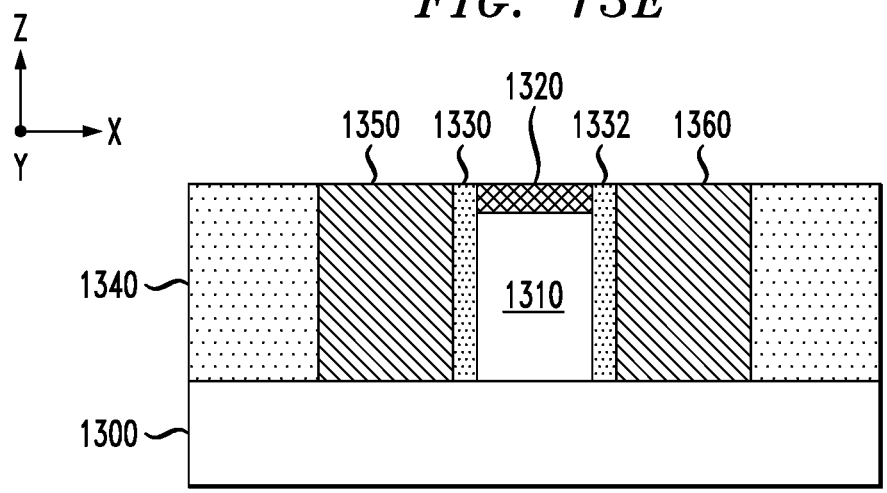
Figure 13F:
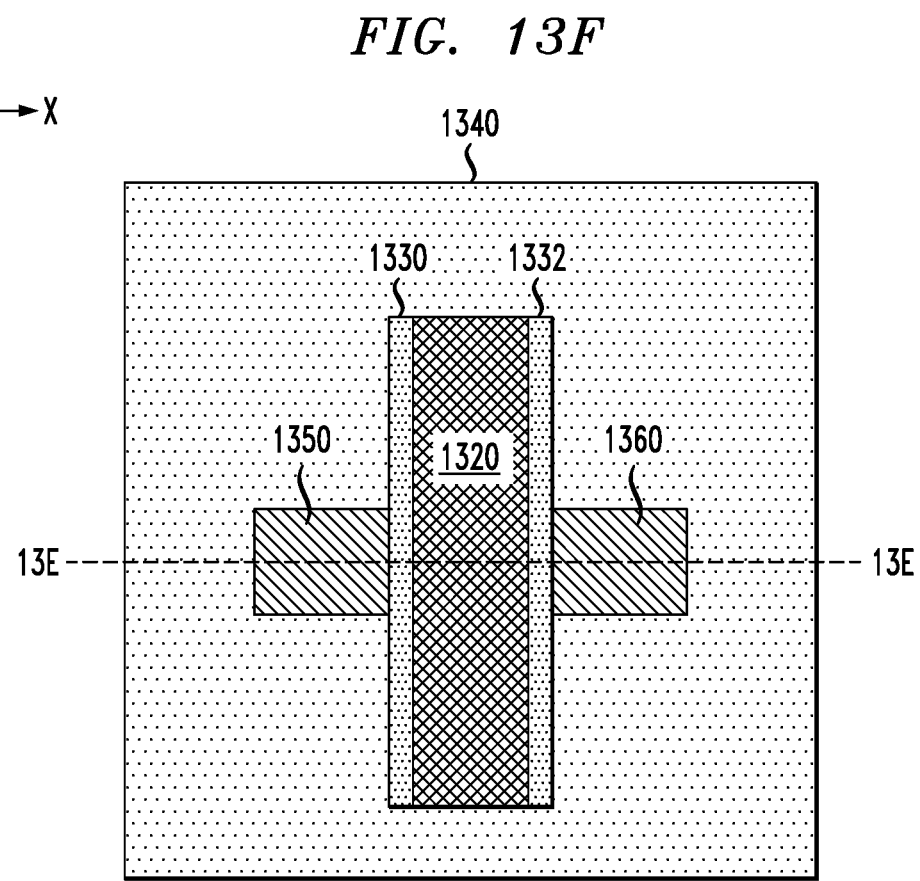

Next, FIGS. 13E and 13F are schematic views of the PCM device at an intermediate stage of fabrication, wherein FIG. 13E is a schematic cross-sectional side view (X-Z plane) of the PCM device taken along line 13E-13E in FIG. 13F, and wherein FIG. 13F is a schematic top plan view (X-Y plane) of the PCM device shown in FIG. 13E. As shown in FIGS. 13E and 13F, the intermediate structure further comprises first and second programming electrodes 1350 and 1360 which are disposed in contact with portions of the first and second resistive liners 1330 and 1332, respectively, and which are disposed in alignment on opposing sides of the PCM element 1310. In some embodiments, the first and second programming electrodes 1350 and 1360 are formed by depositing a layer of metallic material over the surface of the intermediate structure shown in FIGS. 13C and 13D to fill the first and second trenches 1340-1 and 1340-2 with the metallic material, followed by a planarization process to remove the overburden metallic material on the surface of the second insulating layer 1340 and thereby form the first and second programming electrodes 1350 and 1360. The first and second programming electrodes 1350 and 1360 can be formed of any suitable metallic material such as tungsten or TiN.

Figure 13G:
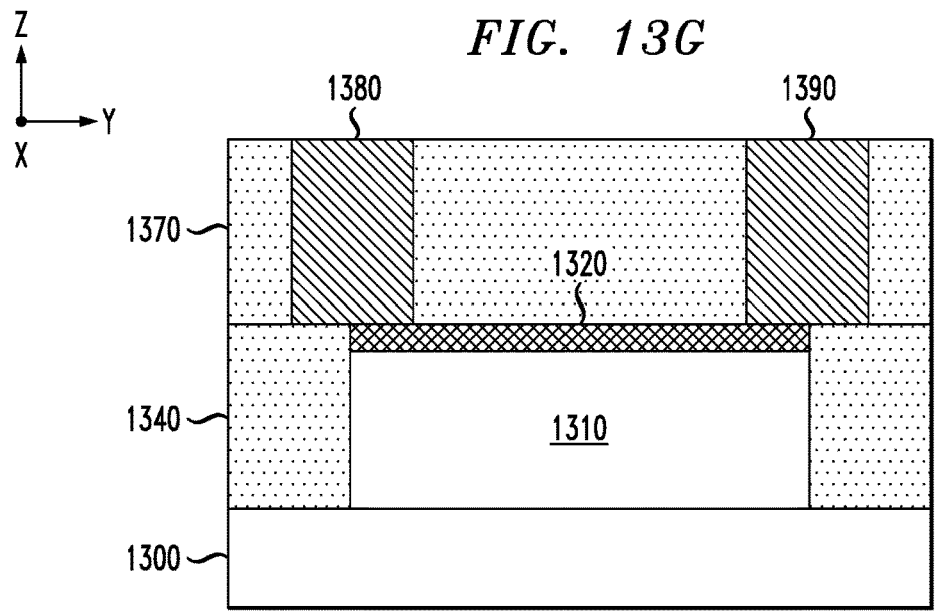
Figure 13H:
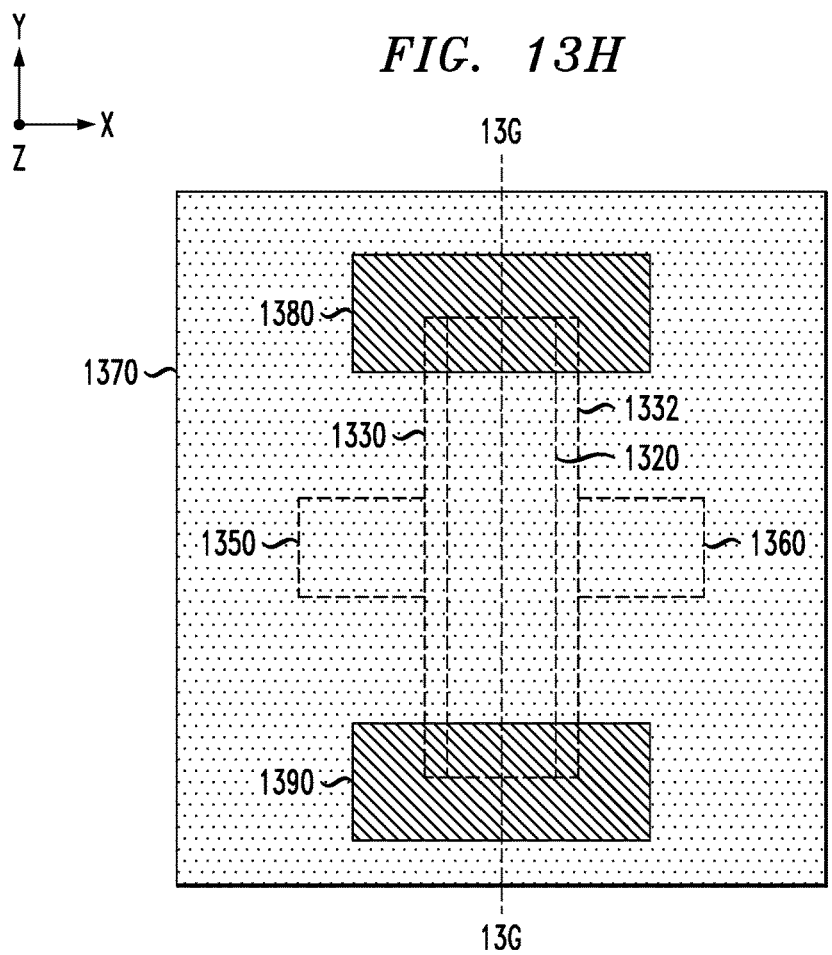

Next, FIGS. 13G and 13H are schematic views of the PCM device at an intermediate stage of fabrication, wherein FIG. 13G is a schematic cross-sectional side view (Y-Z plane) of the PCM device taken along line 13G-13G in FIG. 13H, and wherein FIG. 13H is a schematic top plan view (X-Y plane) of the PCM device shown in FIG. 13G. As shown in FIGS. 13G and 13H, the intermediate structure further comprises a third insulating layer 1370 formed over the second insulating layer 1340, and first and second readout electrodes 1380 and 1390 formed in the third insulating layer 1370 in alignment with end portions of the PCM element 1310 and first and second resistive liners 1330 and 1332. In particular, the first readout electrode 1380 is disposed in contact with first end portions of both the first and second resistive liners 1330 and 1332, and the second readout electrode 1390 is disposed in contact with second end portions of both the first and second resistive liners 1330 and 1332. In this structural configuration, as specifically shown in FIG. 13G, the hard mask layer 1320 serves to electrically insulate the PCM element 1310 from contact with the first and second readout electrodes 1380 and 1390.

In some embodiments, the first and second readout electrodes 1380 and 1390 are formed in the third insulating layer 1370 using the same or similar techniques as discussed above for forming the first and second programming electrodes 1350 and 1360 in the second insulating layer 1340. In some embodiments, the third insulating layer 1370 is formed of the same or similar materials as the second insulating layer 1340. In some embodiments, the first and second readout electrodes 1380 and 1390 are formed of the same or similar metallic material as the first and second programming electrodes 1350 and 1360.

It is to be noted that the exemplary PCM device structure shown in FIGS. 13G and 13H is similar to the structure of the PCM device 300 of FIG. 3 with respect to having first and second programming electrodes disposed in alignment on opposing first and second surfaces of a PCM element and in contact with first and second resistive liners formed on the first and second surfaces of the PCM element. However, the exemplary embodiment of the PCM device shown in FIGS. 13G and 13H comprises first and second readout electrodes 1380 and 1390 which are in contact with both the first and second resistive liners 1330 and 1332, while the readout electrodes 150 and 160 shown in FIG. 3 make contact to the resistive liner 120 but not the resistive liner 320. In this regard, the exemplary PCM device shown in FIGS. 13G and 13H allows readout current to flow into both resistive liners from, e.g., the first readout electrode 1380, and readout current to flow from both resistive liners to, e.g., the second readout electrode 1390, when performing a read operation to read a programmed state of the PCM device.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a phase-change element;
a resistive liner disposed in contact with a first surface of the phase-change element;
a first electrode coupled to a first end portion of the resistive liner;
a second electrode coupled to a second end portion of the resistive liner; and
a third electrode coupled to the first surface of the phase-change element.

2. The device of claim 1, wherein the third electrode is coupled to the first surface of the phase-change element through the resistive liner, wherein a portion of the resistive liner is disposed between the third electrode and the first surface of the phase-change element.

3. The device of claim 1, wherein the first and second end portions of the resistive liner extend past respective first and second side surfaces of the phase-change element, wherein the first and second side surfaces are opposing surfaces of the phase-change element.

4. The device of claim 1, further comprising a fourth electrode coupled to a second surface of the phase-change element, opposite the first surface of the phase-change element.

5. The device of claim 4, further comprising a second resistive liner disposed in contact with the second surface of the phase-change element.

6. The device of claim 4, wherein the third and fourth electrodes are configured to program a resistive state of the phase-change element, and wherein the first and second electrodes are configured to read a programmed resistive state of the phase-change element.

7. The device of claim 4, wherein the third and fourth electrodes have a same geometric footprint and are disposed in alignment to each other on the opposite first and second surfaces of the phase-change element.

8. The device of claim 4, wherein the third and fourth electrodes have different geometric footprints.

9. The device of claim 1, wherein a portion of the first electrode is disposed in contact with a first side surface of the phase-change element, and wherein a portion of the second electrode is disposed in contact with a second side surface of the phase-change element, opposite the first side surface of the phase-change element.

10. The device of claim 1, wherein the phase-change element comprises a chalcogenide alloy of germanium (Ge), antimony (Sb) and tellurium (Te).

11. The device of claim 1, wherein the resistive liner comprises one of tantalum nitride material, hydrogen-doped carbon material, and a conducting oxide material.

12. The device of claim 1, wherein:
the resistive liner is configured to have a resistance which is greater than a resistance of a crystalline region of the phase-change element, and which is less than a resistance of an amorphous region of the phase-change element;
when the phase-change element comprises a region of amorphous phase-change material, at least the resistive liner is configured to electrically shunt the region of amorphous phase-change material during a readout operation which is performed using the first and second electrodes of the device; and
when the phase-change element comprises substantially all crystalline phase-change material, the phase-change element electrically shunts the resistive liner during a readout operation which is performed using the first and second electrodes of the device.

13. The device of claim 1, wherein the device comprises a resistive memory device in which the resistive liner is configured to mitigate an effect of resistive drift of an amorphous region within the phase-change element and thereby maintain a stable resistive state of the phase-change element.

14. A device, comprising:
a resistive processing unit system comprising a cross-bar array of resistive processing unit cells, wherein the resistive processing unit cells comprise respective resistive memory devices, wherein at least one resistive memory device comprises:
a phase-change element;
a resistive liner disposed in contact with a first surface of the phase-change element;

a first electrode coupled to a first end portion of the resistive liner;

a second electrode coupled to a second end portion of the resistive liner; and a third electrode coupled to the first surface of the phase-change element.

15. The device of claim 14, wherein the first and second end portions of the resistive liner extend past respective first and second side surfaces of the phase-change element, wherein the first and second side surfaces are opposing surfaces of the phase-change element.

16. The device of claim 14, further comprising a fourth electrode coupled to a second surface of the phase-change element, which is opposite the first surface of the phase-change element.

17. The device of claim 14, wherein:

the resistive processing unit system further comprises control circuity coupled to the cross-bar array of resistive processing unit cells;

the control circuity is configured to program a resistive state of the at least one resistive memory device by applying a programming pules to at least the third electrode; and the control circuity is configured to read a programmed state of the at least one resistive memory device by applying a read pulse to the first electrode and sensing a read current that is output from the second electrode.

18. A system, comprising:

a neuromorphic system comprising an artificial neural network, wherein the artificial neural network comprises neuron devices, and an array of synaptic devices which connect the neuron devices, wherein the synaptic devices comprise respective multi-level resistive memory devices which are configured encode respective synaptic weights, wherein at least one multi-level resistive memory device comprises:

a phase-change element;

a resistive liner disposed in contact with a first surface of the phase-change element;

a first electrode coupled to a first end portion of the resistive liner;

a second electrode coupled to a second end portion of the resistive liner; and a third electrode coupled to the first surface of the phase-change element.

19. The system of claim 18, wherein:

the first and second end portions of the resistive liner extend past respective first and second side surfaces of the phase-change element;

the first and second side surfaces are opposing surfaces of the phase-change element; and the at least one multi-level resistive memory device further comprises a fourth electrode coupled to a second surface of the phase-change element, which is opposite the first surface of the phase-change element.

20. The system of claim 18, wherein the resistive liner is configured to mitigate an effect of resistive drift of an amorphous region within the phase-change element and thereby maintain a stable resistive state of the at least one multi-level resistive memory device, wherein the resistive state corresponds to a synaptic weight value of the at least one multi-level resistive memory device.

* * * * *